United States Patent
Fattal et al.

(10) Patent No.: US 9,522,819 B2
(45) Date of Patent: Dec. 20, 2016

(54) LIGHT DETECTION SYSTEM INCLUDING A CHIRAL OPTICAL ELEMENT AND OPTICAL ELEMENTS WITH SUB-WAVELENGTH GRATINGS HAVING POSTS WITH VARYING CROSS-SECTIONAL DIMENSIONS

(75) Inventors: David A. Fattal, Mountain View, CA (US); Peter George Hartwell, Sunnyvale, CA (US); Andrei Faraon, Menlo Park, CA (US); Raymond G. Beausoleil, Redmond, WA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 498 days.

(21) Appl. No.: 14/111,720

(22) PCT Filed: Apr. 20, 2011

(86) PCT No.: PCT/US2011/033287
§ 371 (c)(1),
(2), (4) Date: Oct. 14, 2013

(87) PCT Pub. No.: WO2012/144996
PCT Pub. Date: Oct. 26, 2012

(65) Prior Publication Data
US 2014/0034820 A1    Feb. 6, 2014

(51) Int. Cl.
*B81B 3/00* (2006.01)
*G01J 1/42* (2006.01)
(Continued)

(52) U.S. Cl.
CPC ............ *B81B 3/0029* (2013.01); *G01J 1/0266* (2013.01); *G01J 1/0407* (2013.01); *G01J 1/0411* (2013.01);
(Continued)

(58) Field of Classification Search
CPC ....... G02B 5/1809; G02B 5/18; G02B 26/085; G01J 1/0488; G01J 1/0411; G01J 1/0266; G01J 1/4257; G01J 1/0407; G01J 1/0425; G01J 1/0422; B81B 3/00; B81B 3/0018; B81B 3/0029
(Continued)

(56) References Cited

U.S. PATENT DOCUMENTS

| 5,604,345 A | 2/1997 | Matsuura |
| 6,545,808 B1 | 4/2003 | Ehbets et al. |

(Continued)

FOREIGN PATENT DOCUMENTS

| CN | 1519827 A | 8/2004 |
| CN | 1551158 A | 12/2004 |

(Continued)

OTHER PUBLICATIONS

Chiu, C. H. et al., Broadband and omnidirectional antireflection employing disordered GaN nanopillars, Optics Express, vol. 16. No. 12. pp. 8748-8754, May 30, 2008.

(Continued)

*Primary Examiner* — Que T Le
*Assistant Examiner* — Jennifer Bennett
(74) *Attorney, Agent, or Firm* — Olympic Patent Works, PLLC

(57) ABSTRACT

Light-detection systems that do not destroy the light to be detected or change the propagation direction of the light are described. In one aspect, a light-detection system includes an optical element composed of a substrate with a planar surface and a polarization insensitive, high contrast, sub-wavelength grating composed of posts that extend from the planar surface. The posts and/or lattice arrangement of the posts are non-periodically varied to impart orbital angular (Continued)

momentum and at least one helical wavefront on the light transmitted through the optical element.

13 Claims, 22 Drawing Sheets

(51) Int. Cl.
  *G01J 1/04* (2006.01)
  *G01J 1/02* (2006.01)
  *G02B 5/18* (2006.01)
(52) U.S. Cl.
  CPC ............ *G01J 1/0422* (2013.01); *G01J 1/4257* (2013.01); *G02B 5/18* (2013.01); *G02B 5/1809* (2013.01); *G01J 1/0425* (2013.01); *G01J 1/0488* (2013.01)
(58) Field of Classification Search
  USPC ..... 250/237 G, 216, 234; 359/569, 573, 575
  See application file for complete search history.

(56) References Cited

U.S. PATENT DOCUMENTS

| | | | |
|---|---|---|---|
| 7,408,601 B1 | 8/2008 | Huang et al. | |
| 7,526,159 B2 | 4/2009 | Haney et al. | |
| 8,781,276 B2 | 7/2014 | Fattal et al. | |
| 9,103,973 B2* | 8/2015 | Fattal .................. | G02B 5/1809 |
| 2002/0015215 A1* | 2/2002 | Miles .................... | B82Y 20/00 |
| | | | 359/290 |
| 2004/0114642 A1 | 6/2004 | Bullington et al. | |
| 2006/0126183 A1* | 6/2006 | Hasman ............... | G02B 5/1809 |
| | | | 359/573 |
| 2007/0200946 A1 | 8/2007 | Onozawa et al. | |
| 2007/0206287 A1 | 9/2007 | Tsukamoto | |
| 2007/0284510 A1 | 12/2007 | Li et al. | |
| 2008/0137161 A1 | 6/2008 | Roichman et al. | |
| 2008/0193080 A1 | 8/2008 | Cheben et al. | |
| 2009/0020690 A1 | 1/2009 | Toda | |
| 2009/0021884 A1* | 1/2009 | Nakamura ............ | B81B 3/0059 |
| | | | 361/233 |
| 2009/0290836 A1 | 11/2009 | Lee et al. | |
| 2010/0091376 A1 | 4/2010 | Sano et al. | |
| 2010/0126577 A1 | 5/2010 | Wu et al. | |
| 2011/0083739 A1 | 4/2011 | Peng et al. | |
| 2012/0153144 A1* | 6/2012 | McMorran ............ | H01J 37/28 |
| | | | 250/307 |
| 2012/0194912 A1 | 8/2012 | Faraon et al. | |
| 2014/0016181 A1* | 1/2014 | Dal Negro ............ | G02B 5/008 |
| | | | 359/298 |

FOREIGN PATENT DOCUMENTS

| | | | |
|---|---|---|---|
| CN | 101221256 A | 7/2008 | |
| CN | 101251655 A | 8/2008 | |
| CN | 101295076 A | 10/2008 | |
| CN | 101435890 A | 5/2009 | |
| CN | 101902276 A | 12/2010 | |
| JP | 2008216602 | 9/2008 | |
| JP | 2010079041 A | 4/2010 | |
| JP | 2010212625 A | 9/2010 | |
| KR | 100803288 B1 | 2/2008 | |
| TW | 201140141 A | 8/2007 | |
| TW | 201021220 A | 6/2010 | |
| WO | WO-9952006 A2 | 10/1999 | |
| WO | WO-2009043880 A1 | 4/2009 | |
| WO | WO-2010110504 A1 | 9/2010 | |
| WO | WO 2011008216 A1 * | 1/2011 | ............... G02B 5/08 |
| WO | WO-2011037563 A1 | 3/2011 | |

OTHER PUBLICATIONS

Cui, Yonghao et al., "Electro-Thermally tunable Silicon Photonic Crystal Lens", IEEE 2010, pp. 188-191.
International Search Report, PCT Application No. PCT/US2011/033295, Korean Intellectual Property Office, Jan. 2, 2012.
Jahns, Jurgen, "Planar Packaging of Free-Space Optical Interconnections", IEEE, vol. 82 No. 11, Nov. 1994, pp. 1623-1631.
Zhou, Z. et al., Silicon nanophotonic devices based on resonance enhancement, Journal of Nanophotonics. vol. 4, 041001, Nov. 24, 2010.
Dickensheets, D. L. et al., 2008 IEEE/LEOS International Conference on Optical MEMS and Nanophotonics, Aug. 11, 2008, pp. 54-55.
Padgett, Miles et al., "Light with a twist in its tail", Contemporary Physics, 2000, vol. 41, No. 5, pp. 275-285.
International Search Report, Jan. 11, 2012, PCT Patent Application No. PCT/US11/33287, Filed Apr. 20, 2011.
European Search Report received in EP Application No. 11863987.1, Nov. 17, 2014, 3 pages.
Extended European Search Report received in EP Application No. 11864014.3, Mar. 2, 2015, 9 pages.
International Preliminary Report on Patentability received in PCT Application No. PCT/US2011/033287, Oct. 31, 2013, 6 pages.
Kazuhiro Takahashi, "A Two-Dimensional f-θ Micro Optical Lens Scanner With Electrostatic Comb-Drive XY-Stage," IEICE Electronics Express 2.21, 2005, pp. 542-547, https://www.jstage.jst.go.jp/article/elex/2/21/2_21_542/_article.
Hyunhee Choi, "Holographic Inscription of Helical Wavefronts In A Liquid Crystal Polarization Grating," Applied Physics Letters 91.14, 2007, 3 pages, http://scitation.aip.org/content/aip/journal/apl/91/14/10.1063/1.2793173.

* cited by examiner

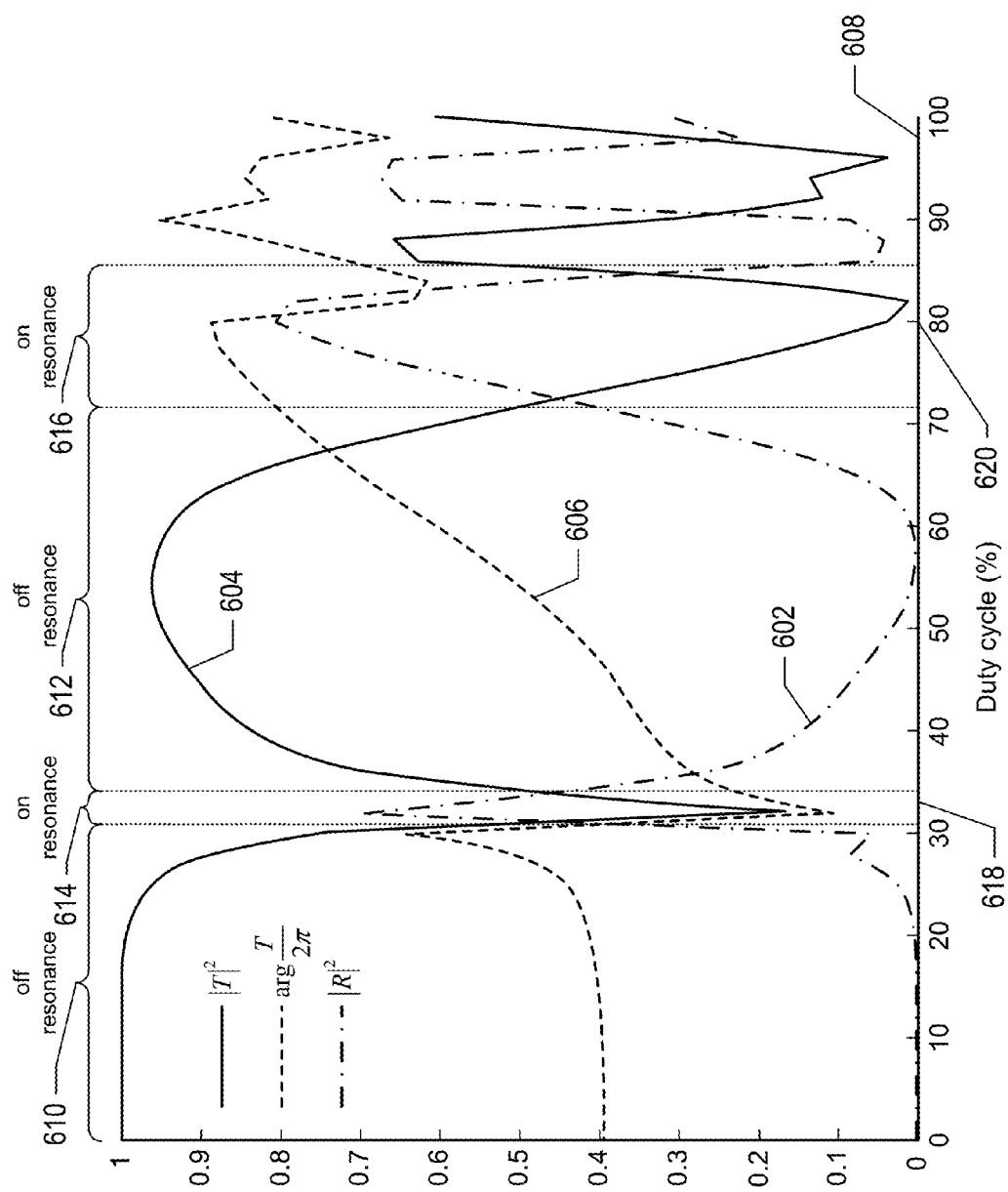

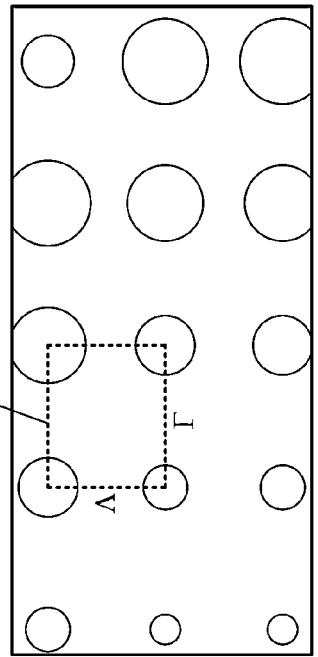
FIG. 7A
FIG. 7B
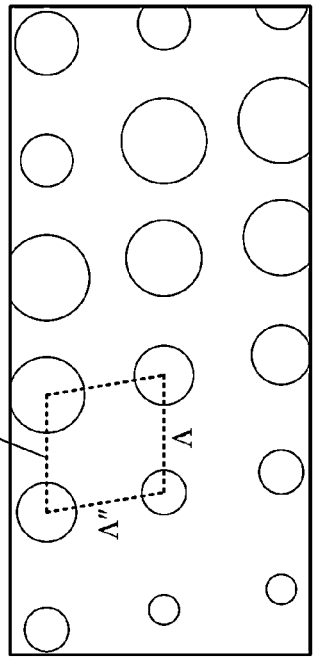
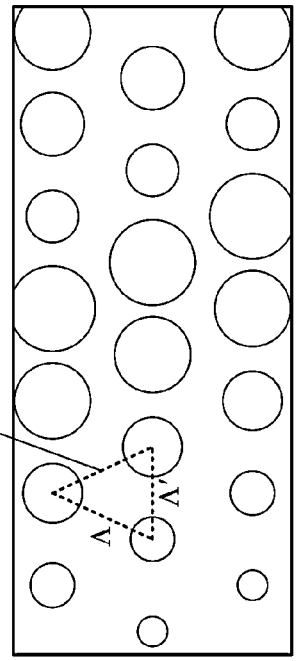
FIG. 7C
FIG. 7D

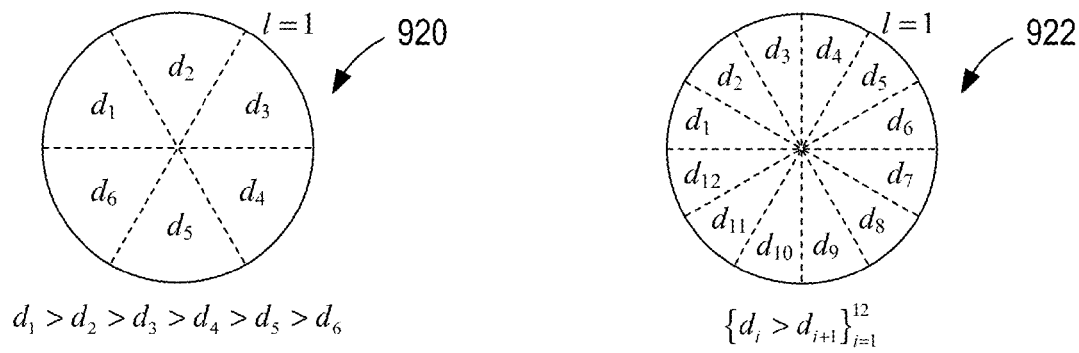
FIG. 9C
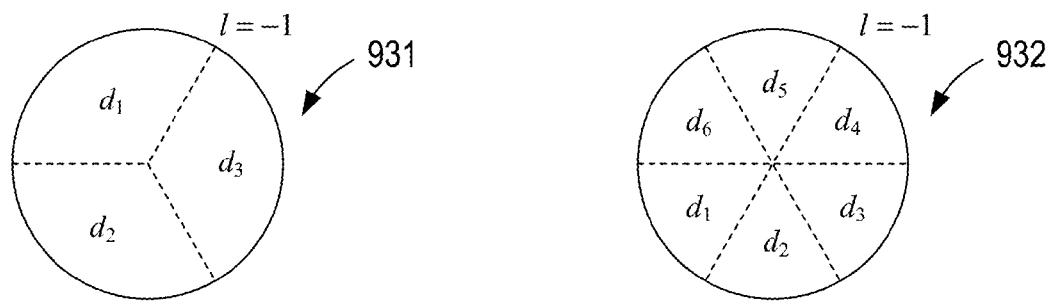
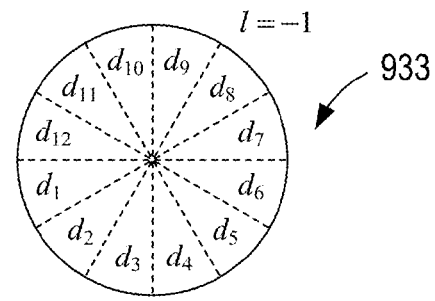
FIG. 9D

US 9,522,819 B2

LIGHT DETECTION SYSTEM INCLUDING A CHIRAL OPTICAL ELEMENT AND OPTICAL ELEMENTS WITH SUB-WAVELENGTH GRATINGS HAVING POSTS WITH VARYING CROSS-SECTIONAL DIMENSIONS

TECHNICAL FIELD

This disclosure relates to light detectors, and in particular, to light-detection systems with planar sub-wavelength gratings.

BACKGROUND

Typical photodetectors are composed of semiconductors that convert incident light into either a current or voltage, depending on how the photodetectors are configured to operate. Consider for example a simple pn or p-i-n junction photodiode. When a beam of photons with energies exceeding the band gap of the photodiode strike the photodiode, most of the photons are absorbed by exciting electrons from the valence band into the conduction band, thereby creating free electrons in the conduction band and a corresponding number of free, positively-charged holes in the valence band. When the absorption occurs in the junction's depletion region, or at least one diffusion length away from the depletion region, electrons in the conduction band and holes in the valence band are swept from the junction by an electric field formed across the depletion region. The field drives holes toward an anode and electrons toward a cathode to produce a photocurrent. In this same manner, typical semiconductor-based photodetectors destroy much of the incident light via absorption.

In recent years, radiation pressure-based photodetectors have been developed to detect light without destroying the light. Radiation pressure is the pressure exerted by an incident beam of light upon a surface located in the path of the beam. However, detecting light with a radiation pressure-based photodetector involves transferring the linear momentum of the beam to a mechanical object, such as a mirror connected to a pressure sensor, which in turn changes the direction of the beam. Physicists and engineers seek systems for detecting a beam of light without destroying the light or changing the direction of the beam.

BRIEF DESCRIPTION OF THE DRAWINGS

FIG. 6 shows example plots of reflection and transmission coefficients and transmitted phase for a sub-wavelength grating composed of a hexagonal lattice of posts.

FIGS. 7A-7D show four examples of two-dimensional lattice types.

FIGS. 9A-9D shows of examples sub-wavelength grating patterns for a chiral optical element configured to output a Laguerre-Gaussion beam of light with a $LG_{10}$ transverse mode.

DETAILED DESCRIPTION

Light-detection systems that do not destroy the light to be detected or change the propagation direction of the light are described. The light-detection systems include a micro-electromechanical system ("MEMS") wafer and a chiral optical element embedded within a movable element of the MEMS wafer. The chiral optical element includes a planar, polarization insensitive sub-wavelength grating ("SWG") configured to impart angular momentum on the light to be detected. When the light passes through the SWG, the light exerts a torque on the optical element, which, in turn, rotates the movable element. A measurable rotational change in the movable element indicates the presence of the light.

The detailed description is organized as follows. Because the chiral optical elements are configured to impart angular momentum on transmitted light, a general description of angular momentum of light is provided in a first subsection. A general description of SWGs is provided in a second subsection. A description of various examples of chiral optical elements that impart angular momentum on transmitted light is provided in a third subsection. Examples of various light-detection systems that incorporate chiral optical elements to detect light without destroying the light or changing the propagation direction are provided in a fourth subsection.

In the following description, the term "light" refers to electromagnetic radiation with wavelengths in the visible and non-visible portions of the electromagnetic spectrum, including infrared and ultra-violet portions of the electromagnetic spectrum.

Angular Momentum of Light

Figure 1:
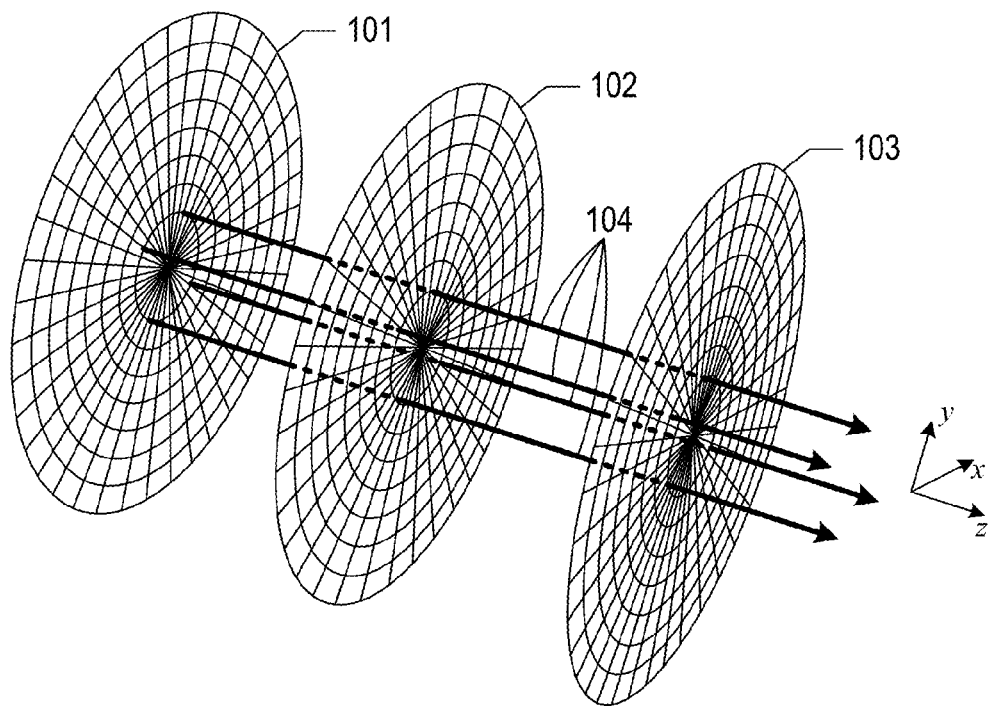
FIG. 1 shows a perspective view of three parallel planar wavefronts of a beam of light.

A light beam consists of a stream of photons. Each photon has an energy $E = \hbar \omega$, where $\hbar$ is the reduced Planck constant and $\omega$ is the angular frequency of the photon. Each photon is also expected to carry a linear momentum $p = E/c = \hbar k$, where c is the free space speed of light, and k is the wave number or magnitude of the wavevector $\overline{k}$ (i.e., $k=|\overline{k}|$) which points in the direction the photon is propagating. The linear momentum of a photon is typically directed parallel to the beam axis and can also be represented as a vector $\overline{p}=\hbar \overline{k}$. FIG. 1 shows a perspective view of three parallel planar wavefronts 101-103 of a beam of light. The beam axis corresponds to the z-axis with the wavefronts 101-103 oriented parallel to the xy-plane. Each photon has an associated wavevector, or linear momentum, represented by vectors 104, directed along the beam axis and oriented perpendicular to the wavefronts 101-103.

Figure 2:
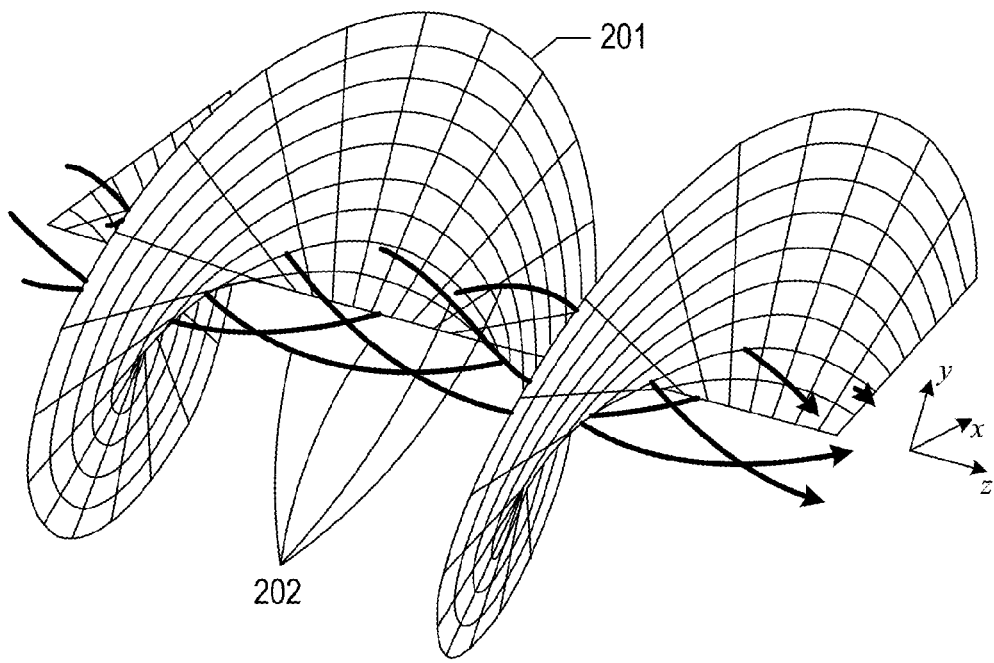
FIG. 2 shows a perspective view of a single helical wavefront of a beam of light.

A beam of light may also carry two types of angular momentum referred to as "orbital" angular momentum and "spin" angular momentum. Orbital angular momentum is an intrinsic property of a photon and appears as a result of an azimuthal component of the linear momentum of the light present in a beam with helical wavefronts. In other words, beams with helical wavefronts have wavevectors that spiral around the beam axis and correspond to photons with orbital angular momentum. FIG. 2 shows a perspective view of a single helical wavefront 201 of a beam of light. The beam axis corresponds to the z-axis with the helical wavefront 201 spiraling around the beam axis as the beam propagates in the z-direction. Each photon has an associated wavevector that spirals around the beam axis, such as the four spiraling wavevectors 202. In addition to the wavevectors spiraling around the beam axis, the Poynting vector spiral around the beam axis, and the orbital angular momentum of each photon spirals around the beam axis with an azimuthal component.

Using complex notation, the electric field component of a beam with photons carrying a well-defined value of the orbital angular momentum can be written as $$\overline{E}(r,\theta)=\overline{E}_0(r)\exp(il\phi)$$

where r and θ are polar coordinates in the xy-plane and l is an integer referred to as the orbital helicity. Each photon carries a quantized intrinsic orbital angular momentum, denoted by $l\hbar$, directed along the beam axis. The beam is composed of $|l|$ intertwined helical wavefronts with a sense of rotation or handedness represented by the sign of l. In the following description, the sign of the orbital helicity l is defined from the point of view of an observer looking along the beam axis toward the source of the beam. A laser beam with l equal to "0" does not have a helical wavefront and the photons have no orbital angular momentum.

Figure 3A:
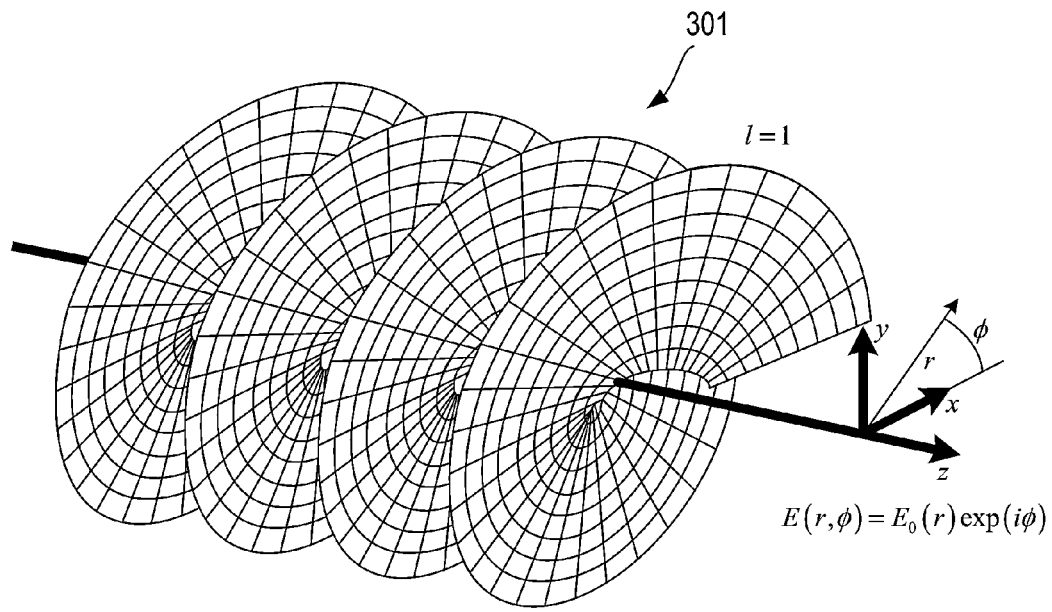
FIGS. 3A-3D show isometric views of helical wavefronts of four different beams of light.
Figure 3B:
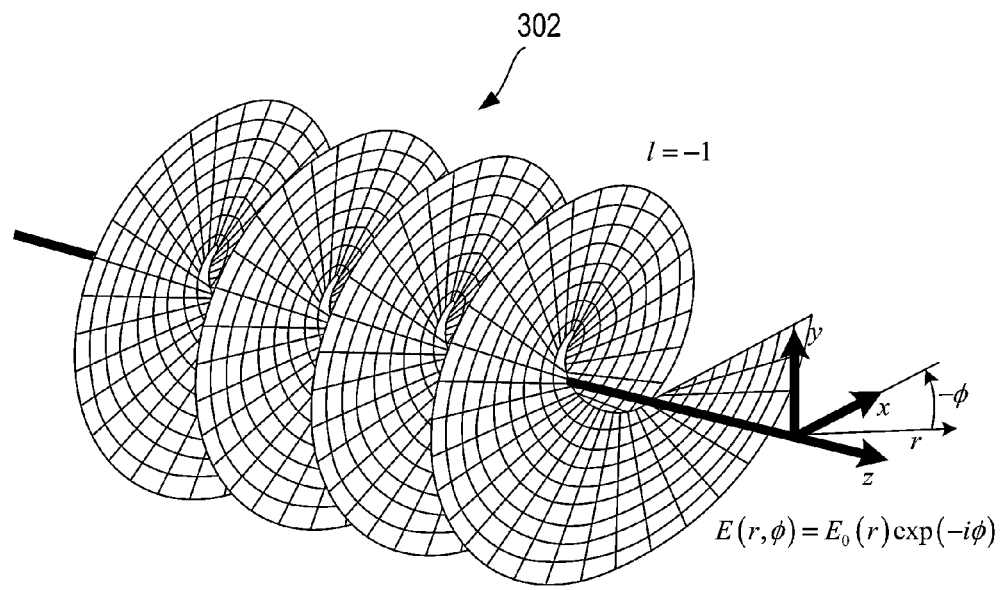
Figure 3C:
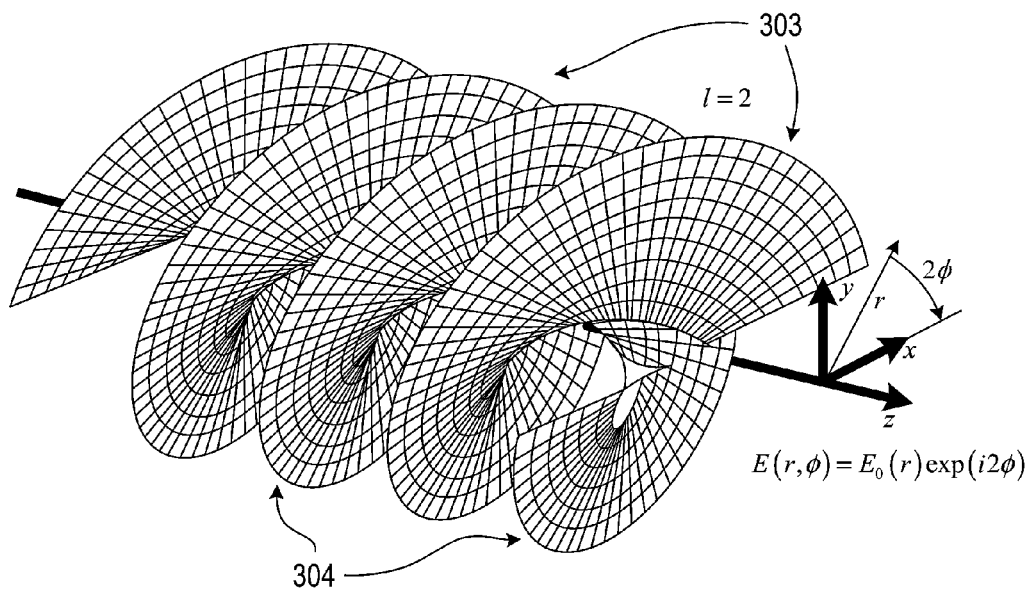
Figure 3D:
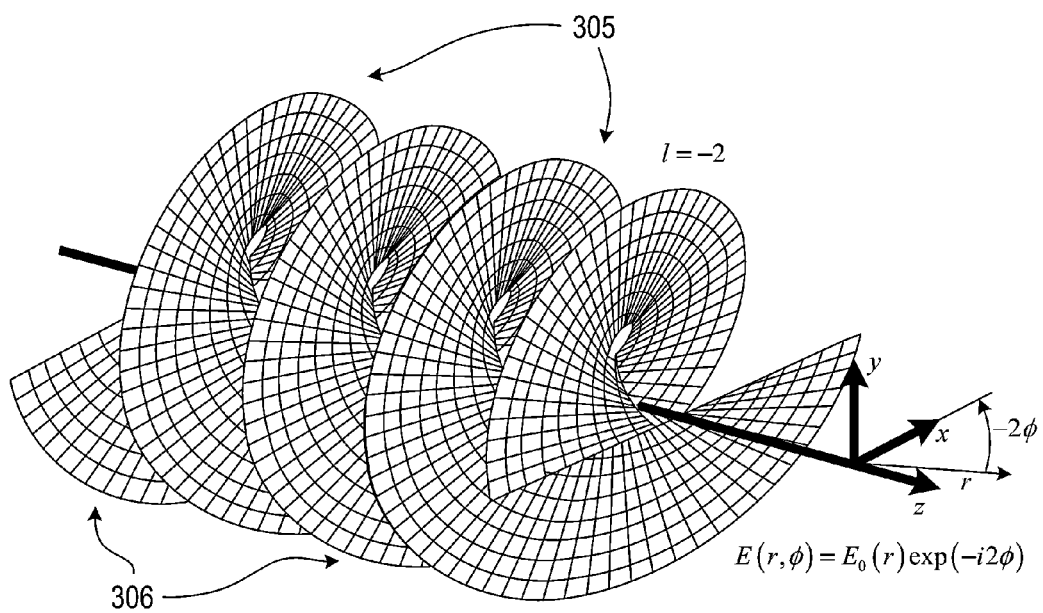

FIGS. 3A-3D show isometric views of helical wavefronts of four different beams of light. In FIG. 3A, the beam is composed of a single helical wavefront 301 that rotates in a clockwise manner as seen by an observer looking along the beam axis toward the beam source (i.e., l=1). From this point of view each photon carries an orbital angular momentum of $+\hbar$. By contrast, in FIG. 3B, the beam is composed of a single helical wavefront 302 that rotates in a counter-clockwise manner when viewed along the beam axis toward the beam source (i.e., l=-1). From this point of view each photon carries an orbital angular momentum of $-\hbar$. In FIG. 3C, the beam is composed of two intertwined helical wavefronts 303 and 304 that rotate in a clockwise manner as seen by an observer looking along the beam axis toward the beam source (i.e., l=2). From this point of view each photon carries an orbital angular momentum of $+2\hbar$. By contrast, in FIG. 3D, the beam is composed of two intertwined helical wavefronts 305 and 306 that rotate in a counter-clockwise manner when viewed along the beam axis toward the beam source (i.e., l=-2). From this point of view each photon carries an orbital angular momentum of $-2\hbar$.

A typical laser beam with planar wavefronts as described above with reference to FIG. 1 can be characterized by Hermite-Gaussian transverse modes. These transverse modes have rectangular symmetry denoted by $HG_{mn}$, where m and n are transverse mode indices that give the number of transverse nodes in the x- and y-directions, respectively. By contrast, beams of light with helical wavefronts described above with reference to FIGS. 2 and 3 can be characterized by Laguerre-Gaussian transverse modes. These transverse modes have circular symmetry denoted by $LG_{lp}$, where the index l represents the number of intertwined helices, and the index p represents the number of radial nodes.

Figure 4A:
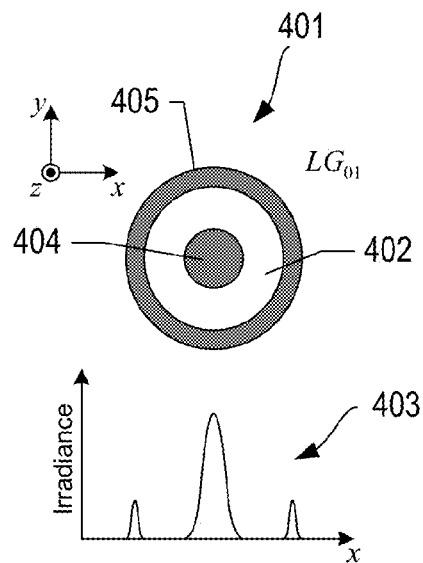
FIGS. 4A-4D show transverse profiles of four Laguerre-Gaussian laser beams viewed along the beam axes toward the beam sources.
Figure 4B:
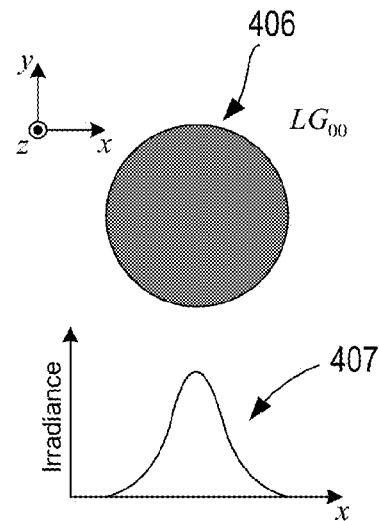
Figure 4C:
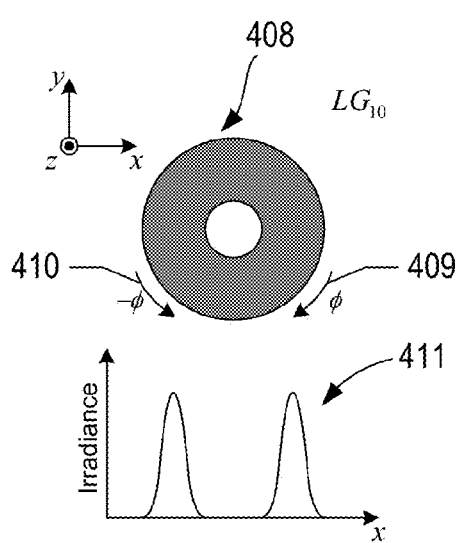
Figure 4D:
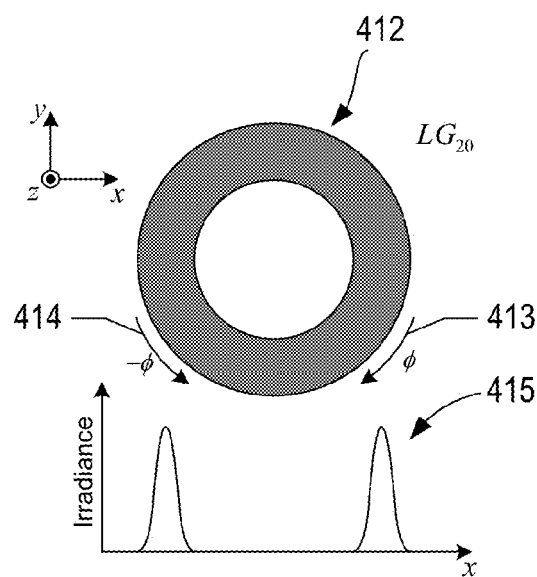

FIGS. 4A-4D show transverse profiles of four Laguerre-Gaussian laser beams viewed along the beam axes toward the beam sources. Each figure also includes an irradiance plot that represents the irradiance across a beam in the x-direction. FIG. 4A shows a transverse profile 401 of a $LG_{01}$ laser beam without a helical wavefront (i.e., l=0) and with a single radial node 402 (i.e., p=1). Irradiance plot 403 reveals that much of the beam's irradiance is concentrated in a central beam 404 surrounded by an annular-shaped outer beam 405. FIG. 4B shows a transverse profile 404 of a $LG_{00}$ laser beam without a helical wavefront (i.e., l=0) and without a radial node (i.e., p=0). Irradiance plot 407 reveals that much of the beam's irradiance is concentrated in the central portion of the beam. The $LG_{00}$ beam shown in FIG. 4B corresponds to a Hermite-Gaussian beam with a $HG_{00}$ transverse mode. FIG. 4C shows a transverse profile 408 of a $LG_{10}$ laser beam with a single helical wavefront (i.e., l=1) and no radial nodes (i.e., p=0). The helical wavefront can have a clockwise rotation 409 as described above with reference to FIG. 3A, or the helical wavefront can have a counter-clockwise rotation 410 as described above with reference to FIG. 3B. Irradiance plot 411 reveals that the $LG_{10}$ beam's irradiance is annular shaped. FIG. 4D shows a transverse profile 412 of a $LG_{20}$ laser beam with two helical wavefronts (i.e., l=2) and no radial nodes (i.e., p=0). The helical wavefronts can have a clockwise rotation 413 as described above with reference to FIG. 3C, or the helical wavefronts can have a counter-clockwise rotation 414 as described above with reference to FIG. 3D. Irradiance plot 415 reveals that the $LG_{20}$ beam is annular shaped and has a larger radius than the $LG_{10}$ beam represented in FIG. 4C.

Now consider the spin angular momentum, which is not an intrinsic property of a photon, but instead is a property of the polarization state of a beam of light. Spin angular momentum, denoted by $\sigma\hbar$, is due to the polarization of the light and is specified by the parameter σ, where σ=±1 for circularly-polarized light, σ=0 for linearly-polarized light, and 0<|σ|<1 for elliptically-polarized light. Like the orbital helicity l, the sign of the parameter σ is associated with the sense of rotation or handedness as defined from the point of view of an observer looking along the beam axis toward the source. From this point of view, when a σ>0, the resultant electric-field vector is rotating clockwise. By contrast, when σ<0, the resultant electric-field vector is rotating counter-clockwise. For example, right-circularly polarized light has σ=+1 and appears to be rotating clockwise when viewed along the beam axis toward the source, and left-circularly polarized light has σ=-1 and appears to be rotating counter-clockwise when viewed along the beam axis toward the source. Left- and right-circularly polarized light have the largest magnitude of spin angular momentum, $\hbar$, while linearly polarized light has no spin angular momentum. In other words, when the photon is linearly polarized there is no azimuthal component to the Poynting vector, resulting in no spin angular momentum.

Based on the above description of orbital and spin angular momentum, a beam of light carries a total angular momentum given by $$J = l\hbar + \sigma\hbar.$$

Sub-Wavelength Gratings

Figure 5A:
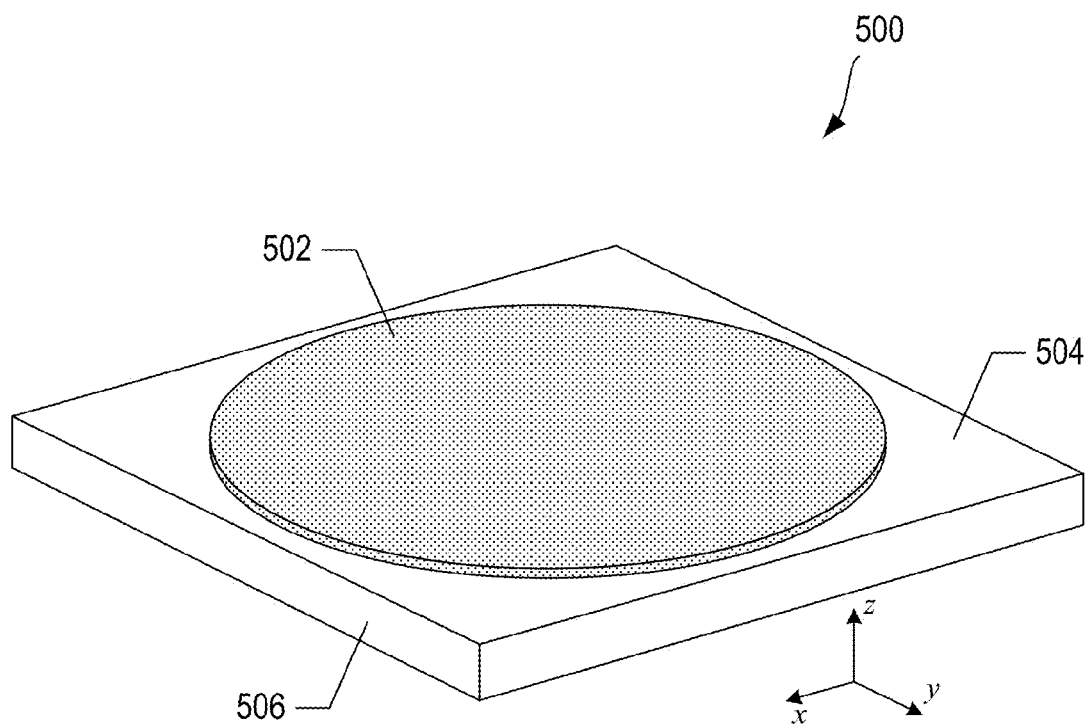
FIGS. 5A-5B show isometric and top views, respectively, of an example optical element.
Figure 5B:
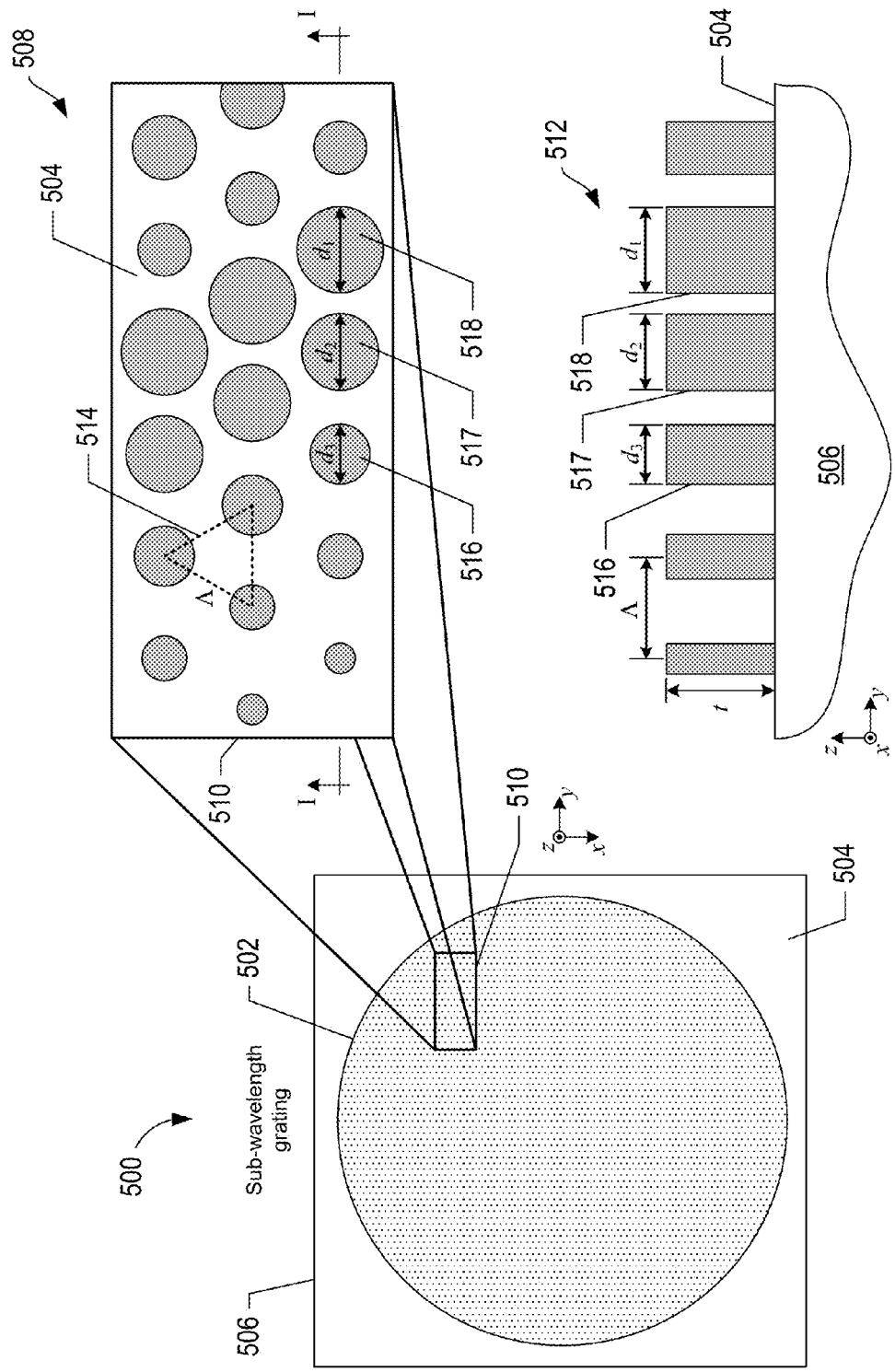

FIGS. 5A-5B show isometric and top views, respectively, of an example optical element 500. The element 500 includes a disk-shaped SWG 502 disposed on a planar surface 504 of a substrate 506. FIG. 5B includes a magnified view 508 of a region 510 of the SWG 502 and a cross-sectional view 512 of the region 510 along a line I-I. The views 508 and 512 reveal that the SWG 502 is composed of a two-dimensional hexagonal lattice of cylindrical posts extending approximately perpendicular from the surface 504. The hexagonal lattice of posts is characterized by an equilateral triangular unit cell 514 with a lattice constant, denoted by $\Lambda$, that corresponds to the distance between the centers of any pair of adjacent posts.

The SWG 502 can be composed of a single elemental semiconductor, such as silicon ("Si") and germanium ("Ge"), or a compound semiconductor, such as a III-V compound semiconductor, where Roman numerals III and V represent elements in the IIIa and Va columns of the Periodic Table of the Elements. III-V compound semiconductors can be composed of column IIIa elements, such as aluminum ("Al"), gallium ("Ga"), and indium ("In"), in combination with column Va elements, such as nitrogen ("N"), phosphorus ("P"), arsenic ("As"), and antimony ("Sb"). III-V compound semiconductors can also be further classified according to the relative quantities of III and V elements. For example, binary semiconductor compounds include semiconductors with empirical formulas GaAs, InP, InAs, and GaP; ternary compound semiconductors include semiconductors with empirical formula $GaAs_yP_{1-y}$, where y ranges from greater than 0 to less than 1; and quaternary compound semiconductors include semiconductors with empirical formula $In_xGa_{1-x}As_yP_{1-y}$, where both x and y independently range from greater than 0 to less than 1. Other types of suitable compound semiconductors include II-VI materials, where II and VI represent elements in the IIb and VIa columns of the periodic table. For example, CdSe, ZnSe, ZnS, and ZnO are empirical formulas of exemplary binary II-VI compound semiconductors.

The substrate 504 can be composed of material having a relatively lower refractive index than the SWG 502. For example, the substrate 506 can be composed of quartz, silicon dioxide ('SiO$_2$"), aluminum oxide ("Al$_2$O$_3$"), or a polymer.

Optical elements are compact and can be fabricated with many of the same CMOS-compatible techniques used to fabricate microelectronic devices. For example, an optical element can be fabricated by depositing a semiconductor layer on a planar surface of a substrate using wafer bonding or chemical or physical vapor deposition. The posts comprising an SWG can be formed in the semiconductor layer using photolithography, nanoimprint lithograph, reactive-ion etching, or roll-to-roll processing.

The SWG 502 is a high-contrast SWG because of the relatively high contrast between the refractive index of the material comprising the SWG 502 and the refractive index of the substrate 506, which can be created by forming the posts so that portions of the substrate 506 are exposed between the posts, as shown in the cross-sectional view 512. For example, the elemental semiconductors and many III-V compound semiconductors that can be used to form the SWG 502 have effective refractive indices greater than approximately 3.5 when interacting with light of a wavelength 632.8 nm. By contrast, quartz, SiO$_2$, and polyacrylate used to form the substrate 506 have effective refractive indices less than approximately 1.55 when interacting with light of the same wavelength 632.8 nm.

The lattice constant $\Lambda$ of the SWG 502 is selected so that the optical element 500 does not scatter light into the substrate in an unwanted manner. Unwanted scattering can be prevented by selecting the lattice constant based on a no-scattering limit given by:

$$\Lambda < \frac{2}{\sqrt{3}} \frac{\lambda}{n_s}$$

where $n_s$ is the refractive index of the substrate 506. In addition to selecting the lattice constant based on the no-scattering limit, the element 500 can be configured so that the desired phase difference between two posts separated by $\Lambda$ is less than $\pi$, so that the desired output phase is determined by the lattice at a high enough spatial density. The element 500 can also be configured with a certain numerical aperture ("NA") imposed by the constraint:

$$\Lambda \leq \frac{\lambda}{2 \cdot NA}$$

The SWG 502 is also a "non-periodic" SWG. In other words, the diameters of the posts comprising the SWG 502 are varied. For example, as shown in FIG. 5B, neighboring posts 516-518 have different post diameters $d_1$, $d_2$, and $d_3$, where $d_1 < d_2 < d_3$. The SWG 502 is also referred to as a "sub-wavelength grating" because the post diameters d and lattice constant $\Lambda$ are less than the wavelength $\lambda$ of the light the SWG 502 is configured to interact with.

The resonance of the SWG 502 with the wavelength $\lambda$, is determined by the duty cycle and the thickness of the SWG 502. The duty cycle for a SWG with posts having circular cross sections is given by:

$$\delta = \frac{d}{\Lambda}$$

and the thickness t of the SWG 502 can be selected to allow a large differential phase shift as the duty cycle is varied where:

$$t < \frac{\lambda}{(n_{SWG} - n_s)}$$

where $n_{SWG}$ is the effective refractive index of the SWG 502 at the wavelength $\lambda$. The duty cycle $\delta$ over certain regions of the SWG 502 can be selected so that the SWG 502 is approximately "off-resonance" with the wavelength $\lambda$, resulting in a majority of the light being transmitted through the regions with a high transmittance. Alternatively, the duty cycle over other regions of the SWG 502 can be selected so that the SWG 502 is approximately "on-resonance" with the wavelength $\lambda$, resulting in a majority of the light being reflected from the other regions with a high reflectance.

FIG. 6 shows example plots of reflection and transmission coefficients and transmitted phase based on simulation results for a SWG composed of a hexagonal lattice of Si posts in an oxide matrix. Dot-dash curve 602 represents the squared norm of the reflection coefficient, $|R|^2$, solid curve 604 represents the squared norm of the transmission coefficient, $|T|^2$, and dashed curve 606 represents the transmitted phase, arg $(T/2\pi)$, for light with normal incidence and wavelength 650 nm. The curves 602, 604, and 606 were generated using the open source finite-difference time-difference software MEEP described in "A flexible free-software package for electromagnetic simulations by the FDTD method," A. F. Oskooi et al., *Computer Physics Communications*, 181, 687-702 (2010). The curves 602, 604, and 606 were determined for posts with a fixed thickness of approximately 130 nm, a fixed lattice constant of approximately 475 nm, while the duty cycle was varied from 0% to 100%, as represented by horizontal axis 608. Curves 602 and 604 reveal that the reflection and transmission of light vary smoothly with variations in the duty cycle over the off-resonance intervals 610 and 612. Portions of the off-resonance intervals 610 and 612 indicate that a large portion of the incident light is transmitted through the SWG for duty cycles in the range from 0% to approximately 30% and in the range from approximately 35% to approximately 68%. On the other hand, on-resonance intervals 614 and 616 reveal abrupt decreases in the transmission and increases in the reflection of the light for narrower duty cycle ranges. In particular, the transmission coefficient is less than approximately 0.4 for duty cycles in the narrow range from approximately 31% to approximately 33% and in the range from approximately 74% to approximately 85% with the strongest resonance or reflection occurring for duty cycles at approximately 32% 618 and approximately 80% 620. The transmitted phase over the off-resonance interval 610 remains flat for duty cycles below approximately 25% but increases sharply as the duty cycle approaches 30%. In the on-resonance interval 614, the transmitted phase decreases between approximately 30% and 32%. Between approximately 32% and approximately 80% the transmitted phase 606 varies smoothly over a large range of transmitted phases.

The data represented by the reflection and transmission coefficients and the transmitted phase shown in FIG. 6 can be used to design the SWG of an optical element with desired optical properties. In particular, the larger the post size, the longer light remains trapped within the posts. As a result, a larger transmitted phase is acquired by light transmitted through regions of an SWG with posts having larger dimensions than other regions of the same SWG with posts having smaller dimensions. A SWG with desired optical properties can be obtained by varying the dimensions of the posts while holding the lattice constant fixed (e.g., $\delta(x,y)=d(x,y)/\Lambda$), varying the lattice constant while holding the dimensions of the posts fixed (e.g., $\delta(x,y)=d/\Lambda(x,y)$), or by varying the lattice constant and the dimensions of the posts (e.g., $\delta(x,y)=d(x,y)/\Lambda(x,y)$), where (x,y) is a coordinate in the xy-plane of the SWG.

The SWG of an optical element can also be designed to interact with a particular wavelength $\lambda$ of light by applying a property of Maxwell's equations that relates to a uniform scale of transformation in the design of the SWG. In particular, consider a first SWG configured with a duty cycle $\delta(x,y)$, thickness t, and lattice constant $\Lambda(x,y)$ that produces a complex transmission coefficient $T_0$ and reflection coefficient $R_0$ at a free-space wavelength $\lambda_0$. A second SWG can be obtained with approximately the same optical properties as the first SWG but for a different wavelength $\lambda_0$, by fabricating the second SWG with a duty cycle $\alpha\delta(x,y)$, thickness $\alpha t$, and lattice constant $\alpha\Lambda(x,y)$, where $\alpha=\lambda/\lambda_0$ is a scale factor and provided $\alpha\Lambda(x,y)$ satisfies the no-scattering limit and the numerical aperture constraint. For example, the second SWG has a transmission coefficient $T(\lambda)=T_0(\lambda/\alpha)=T_0(\lambda_0)$ and a reflection coefficient $R(\lambda)=R_0(\lambda/\alpha)=R_0(\lambda_0)$.

SWGs are not limited to a hexagonal lattice of post, as shown in FIG. 5B. Alternatively, the lattice of an SWG can be square, rectangular, rhombic, or parallelogrammic. FIG. 7A shows an example magnified top view of a region of an SWG with a square lattice of posts represented by a square unit cell 702. FIG. 7B shows an example magnified top view of a region of an SWG with a rectangular lattice of posts represented by a rectangular unit cell 704. FIG. 7C shows an example magnified top view of a region of an SWG with a rhombic lattice of posts represented by an isosceles triangle unit cell 706. Finally, FIG. 7D shows an example magnified top view of a region of an SWG with a parallelogrammic lattice of posts represented by a parallelogram unit cell 708. An SWG may also be composed of at least two different lattices types. For example, the posts in certain regions of an SWG can have a square lattice arrangement and posts in other regions of the same SWG can have a rectangular lattice arrangement.

The posts of the SWG 502 are also not limited to having circular cross-sections, as shown in FIGS. 5 and 7. Alternatively, the posts of an SWG can have square, triangular, rectangular, elliptical, or irregular-shaped cross-sections.

Examples of Chiral Optical Elements

Figure 8:
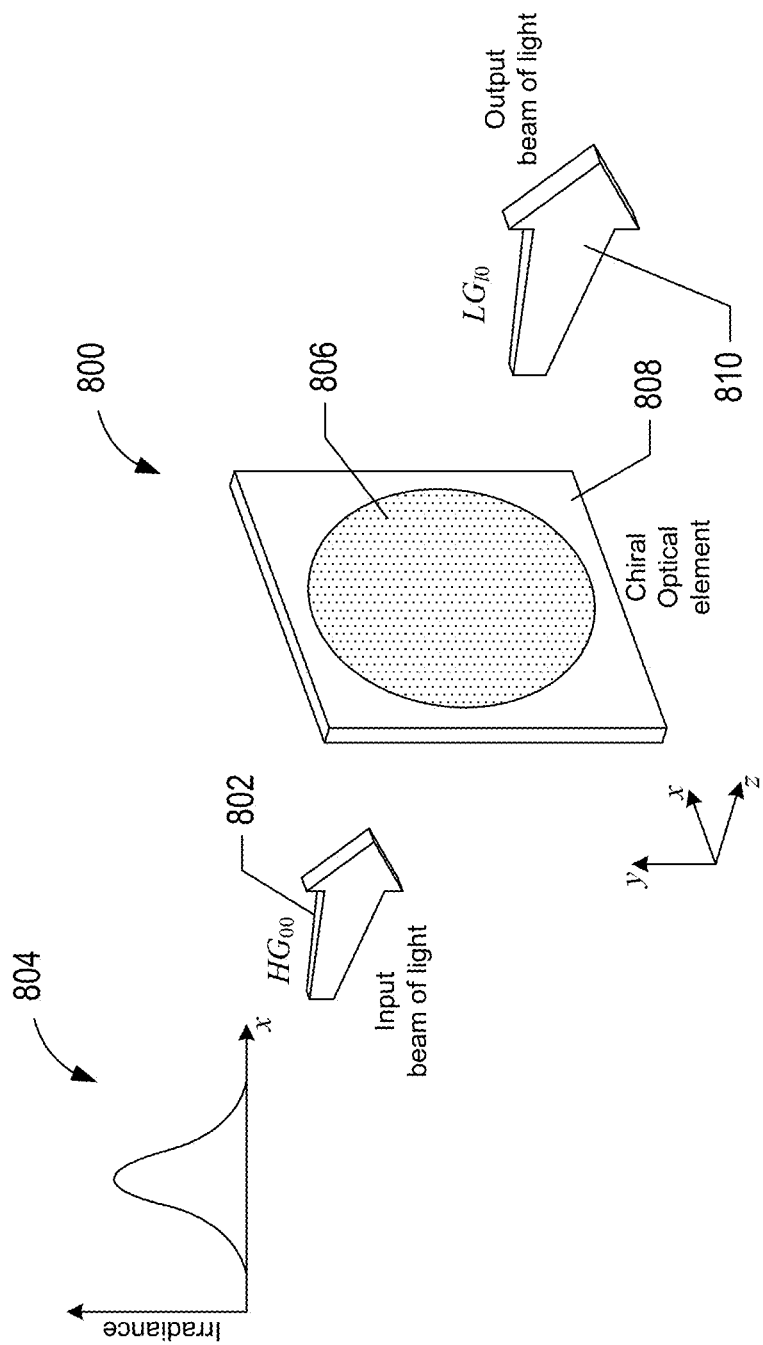
FIG. 8 shows a perspective view of an example chiral optical element placed in the path of an input Gaussian beam of light with a $HG_{00}$ transverse mode.

In this subsection, examples of polarization insensitive SWG post patterns of chiral optical elements are described. The term "chiral" refers to the SWG imparting orbital angular momentum and a helical wavefront to light transmitted through the optical element. In other words, the SWG post patterns enable a chiral optical element to operate as a chiral lens that, for example, receives a Gaussian beam of light with a $HG_{mn}$ transverse mode and outputs a Laguerre-Gaussian beam of light with a $LG_{lp}$ transverse mode. FIG. 8 shows a perspective view of an example chiral optical element 800 placed in the path of a Hermite-Gaussian beam of light 802 with a $HG_{00}$ transverse mode. The beam 802 has planar wavefronts, as described above with reference to FIG. 1, and much of the beam 802 irradiance is concentrated in the central portion of the beam, as represented by irradiance profile 804. The element 800 includes a SWG 806 disposed on a transparent substrate 808. The SWG 806 outputs a Laguerre-Gaussian beam of light 810 with a $LG_{l0}$ transverse mode and the beam 810 has |l| helical wavefronts. The sense of rotation or handedness of the beam 810 is determined by the post pattern of the SWG 806.

For the sake of brevity and convenience, each of the example SWG post patterns of the chiral optical elements described below is based on a fixed lattice constant while only the diameters of the posts are varied to output Laguerre-Gaussian beams. However, SWG post patterns are not intended to be limited to these examples. As explained in the preceding section, the phase front or wavefront of the light transmitted through a SWG can be controlled by varying the size of the posts and/or the lattice constant. In other words, the post sizes and/or lattice constants of a SWG can be selected to output a Laguerre-Gaussian beam of light with a desired $LG_{lp}$ transverse mode.

Figure 9A:
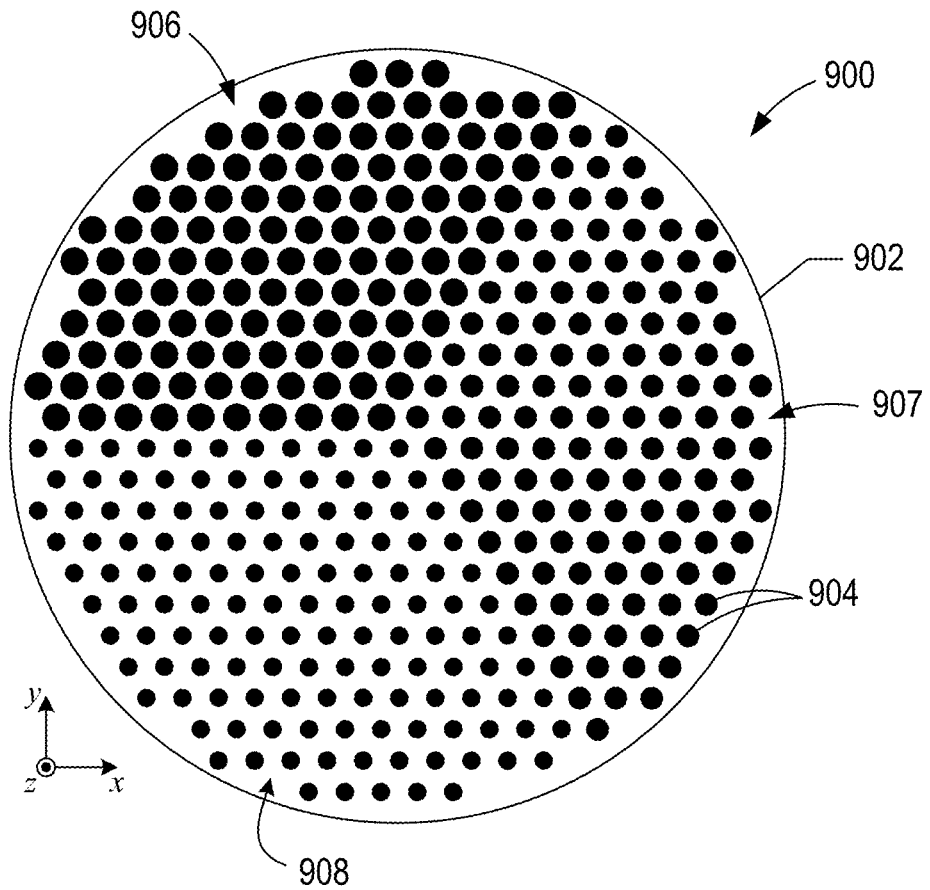

FIG. 9A shows a top-view of an example chiral optical element 900 configured to output light with a Laguerre-Gaussian transverse mode $LG_{10}$. The element 900 includes a substrate 902 and a SWG composed of a two-dimensional hexagonal lattice of cylindrical posts represented by shaded circles 904. The posts extend perpendicular from a planar surface of the substrate 902. In the example of FIG. 9A, the SWG is sub-divided into three wedge-shaped regions 906-908. The posts within each region have approximately the same diameter, and the diameter of the posts decrease from region to region in a clockwise manner beginning with the region 906 and ending with the region 908.

Figure 9B:
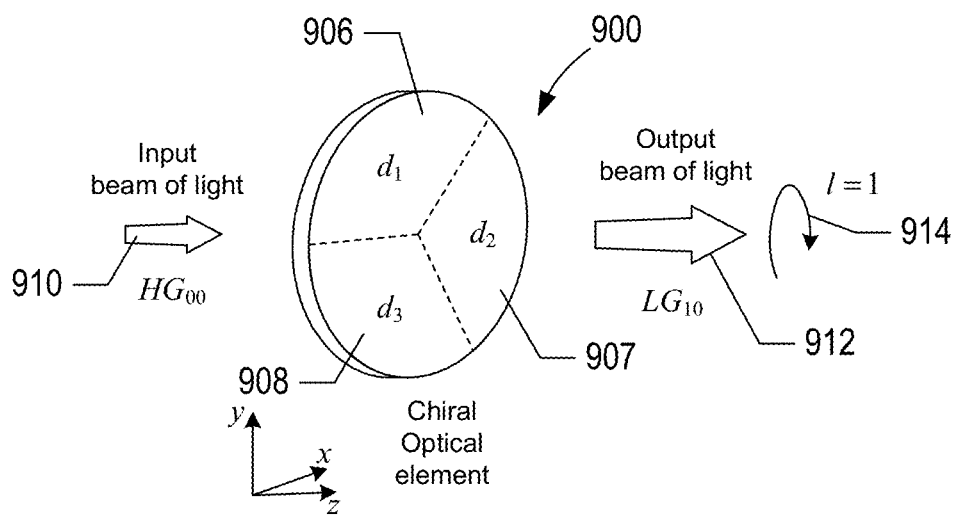

FIG. 9B shows an isometric view of the element 900 with the regions 906-908 represented as $d_1$, $d_2$, and $d_3$, respectively, where $d_1 > d_2 > d_3$. As a Gaussian beam of light 910 is incident on the element 900, a portion of the beam transmitted through the region 906 acquires the largest transmitted phase, a portion of the beam transmitted through the region 907 acquires the second largest transmitted phase, and the portion of the beam transmitted through the region 908 acquires the smallest transmitted phase. As a result, the element 900 produces a Laguerre-Gaussian beam 912 with a $LG_{10}$ transverse mode. To an observer looking toward the element 900 along the beam 912 axis, the beam 912 has a helical wavefront rotating in a clockwise direction (i.e., l=1) 914.

Because the SWG of the chital optical element 900 is composed of three regions, the SWG produces a course helical wavefront of the Laguerre-Gaussian beam. The helical wavefront can be smoothed by increasing the number of SWG regions with a more a more gradual change in the post diameters from region to region. FIG. 9C shows two example chiral optical elements 920 and 922. The element 920 has six wedge-shaped regions and the element 922 has twelve wedge-shaped regions, with the posts in each region of the elements 920 and 922 having the same diameter. When the elements 920 and 922 are substituted for the element 900 shown in FIG. 9B, the elements 920 and 922 also produce a Laguerre-Gaussian beam with a $LG_{10}$ transverse mode, but with a smoother helical wavefront rotating in a clockwise direction (i.e., l=1).

FIG. 9D shows three example chiral optical elements 931-933 that are analogous to the optical elements 900, 920, and 922, but with the diameters of the posts from region to region decreasing in a counter-clockwise direction. When each of the elements 931-933 is substituted for the element 900 shown in FIG. 9B, the elements 931-933 produce Laguerre-Gaussian beams with a $LG_{10}$ transverse mode, but the helical wavefronts rotate in a counter-clockwise direction (i.e., l=−1).

Figure 10A:
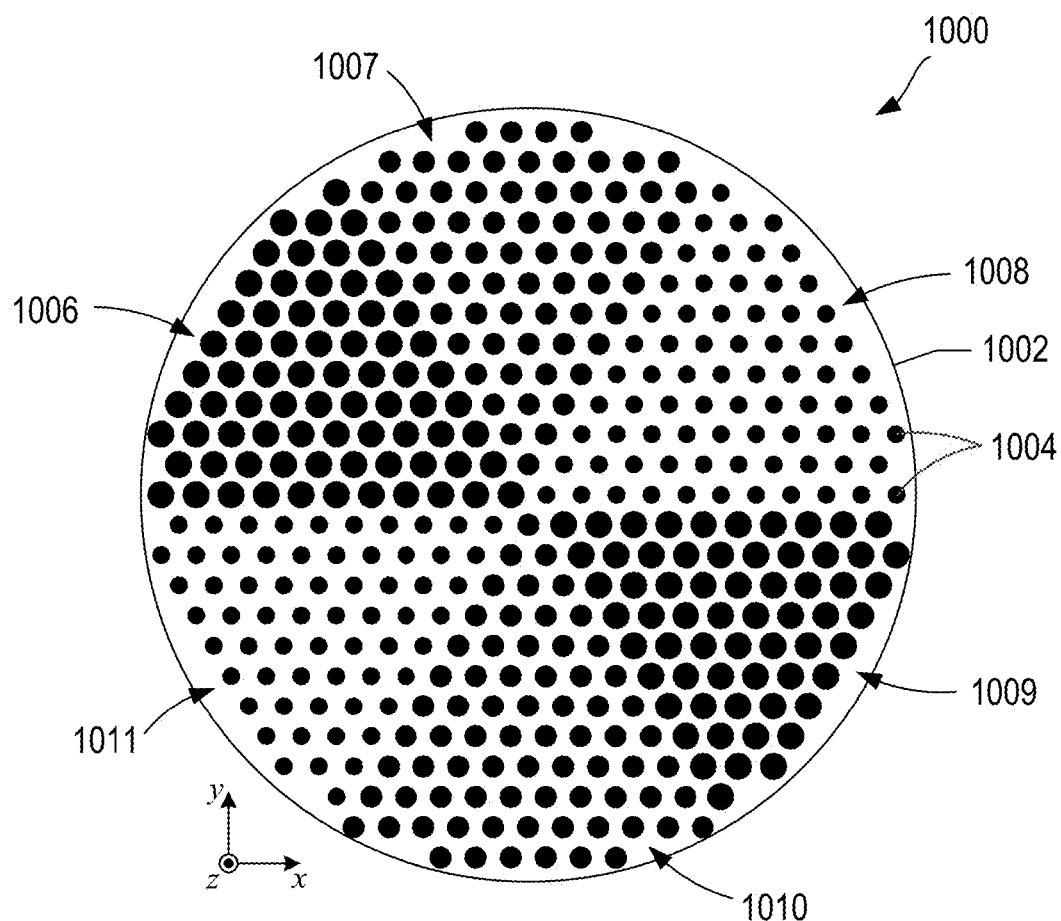
FIGS. 10A-10D shows examples of sub-wavelength grating patterns for a chiral optical element configured to output a Laguerre-Gaussion beam of light with a $LG_{20}$ transverse mode.

FIG. 10A shows a top-view of an example chiral optical element 1000 configured to output light with a Laguerre-Gaussian transverse mode $LG_{20}$. The element 1000 includes a substrate 1002 and a SWG composed of a two-dimensional hexagonal lattice of cylindrical posts represented by shaded circles 1004. The posts comprising the SWG extend perpendicular from a planar surface of the substrate 1002. In the example of FIG. 10A, the SWG is sub-divided into six wedge-shaped regions 1006-1011. The posts within each region have approximately the same diameter. The diameter of the posts in regions 1006-1008 decrease from region to region in a clockwise direction beginning with the region 1006 and ending with the region 1008. The pattern of decrease from region to region is repeated for the regions 1009-1011.

Figure 10B:
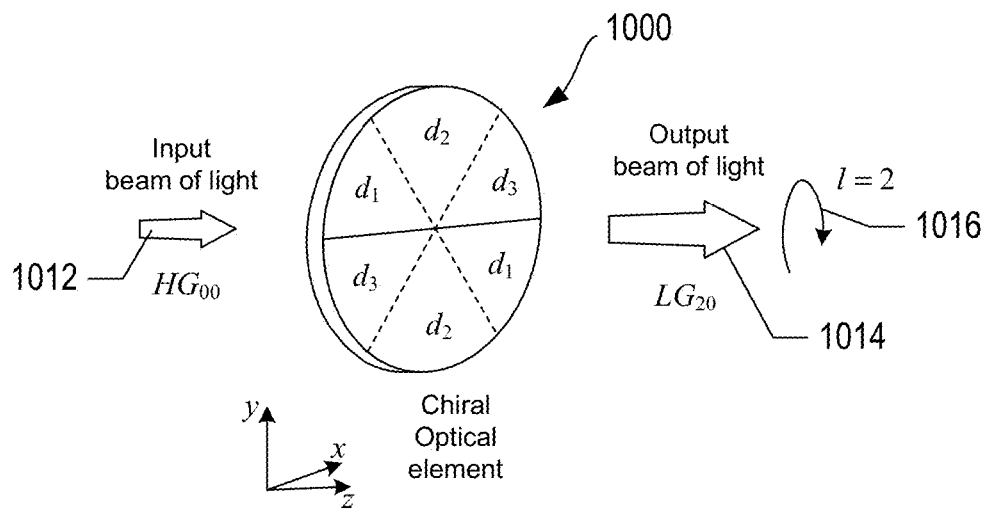

FIG. 10B shows an isometric view of the element 1000 with the post diameters within each region identified as $d_1$, $d_2$, and $d_3$, respectively, where $d_1 > d_2 > d_3$. As a Gaussian beam of light 1012 is incident on the element 1000, portions of the beam transmitted through the regions 1006 and 1009 acquire the largest transmitted phase, portions of the beam transmitted through the regions 1007 and 1010 acquire the second largest transmitted phase, and portions of the beam transmitted through the regions 1008 and 1011 acquire the smallest transmitted phase. The element 1000 produces a Laguerre-Gaussian beam 1014 with a $LG_{20}$ transverse mode. To an observer looking toward the element 1000 along the beam 1014 axis, the beam 1014 has two intertwined helical wavefronts rotating in a clockwise direction (i.e., l=2) 1016. In other words, the regions 1006-1008 are a first set of wedge-shaped regions that produce a first of the two intertwined helical wavefronts, and the regions 1009-1011 are a second set of wedge-shaped regions that produce a second of two the intertwined helical regions.

Figure 10C:
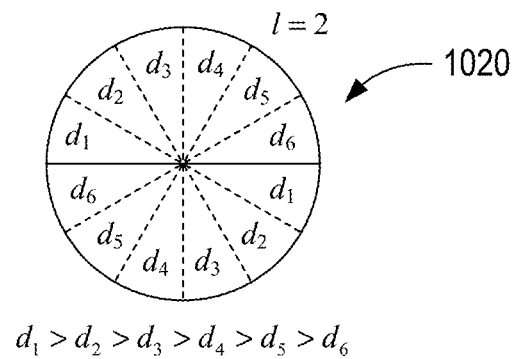

The helical wavefronts can be smoothed by increasing the number of SWG regions with a more gradual change in the post diameters from region to region. FIG. 10C shows an example chiral optical element 1020 with 12 wedge-shaped regions, with the posts in each region having the same diameter. When the element 1020 is substituted for the element 1000 shown in FIG. 10B, the element 1020 also produces a Laguerre-Gaussian beam with a $LG_{20}$ transverse mode, but with smoother intertwined helical wavefronts rotating in a clockwise direction (i.e., l=2)

Figure 10D:

FIG. 10D shows two example chiral optical elements 1031 and 1032 that are analogous to the optical elements 1000 and 1020, but with the diameters of the posts from region to region decreasing in a counter-clockwise direction. When the elements 1031 and 1032 are substituted for the element 1000 shown in FIG. 10B, the elements 1031 and 1032 produce Laguerre-Gaussian beams with a $LG_{20}$ transverse mode, but the intertwined helical wavefronts rotate in a counter-clockwise direction (i.e., l=−2).

Figure 11A:
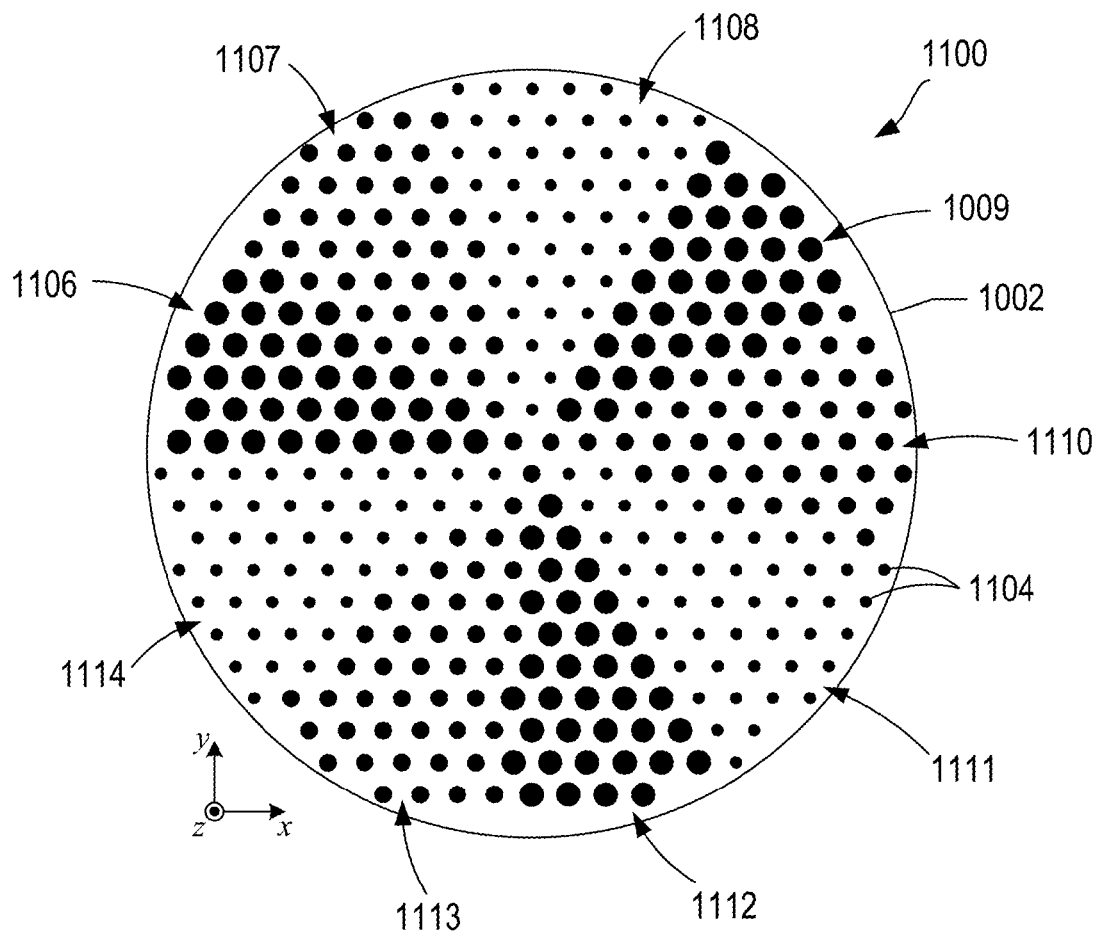
FIGS. 11A-11D shows examples of sub-wavelength grating patterns for a chiral optical element configured to output a Laguerre-Gaussion beam of light with a $LG_{30}$ transverse mode.

FIG. 11A shows a top-view of an example SWG pattern of a chiral optical element 1100 configured to output light with a Laguerre-Gaussian transverse mode $LG_{30}$. The element 1100 includes a substrate 1102 and a SWG composed of a two-dimensional hexagonal lattice of cylindrical posts represented by shaded circles 1104. The posts comprising the SWG extend perpendicular from a planar surface of the substrate 1102. In the example of FIG. 11A, the SWG is sub-divided into six wedge-shaped regions 1106-1114. The posts within each region have approximately the same diameter. The diameter of the posts in regions 1106-1108 decrease from region to region in a clockwise direction beginning with the region 1106 and ending with the region 1108. The pattern of decrease from region to region is repeated for the regions 1109-1111 and regions 1112-1114.

Figure 11B:
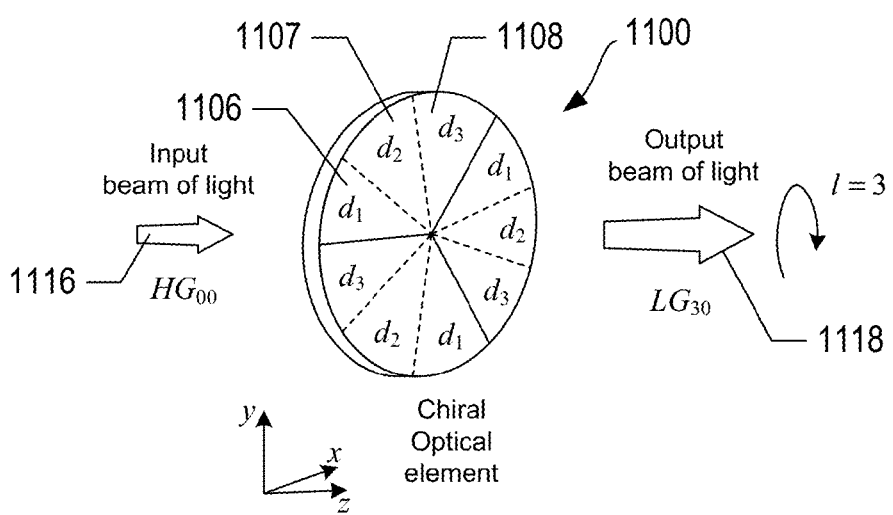

FIG. 11B shows an isometric view of the element 1100 with the post diameters within each region identified as $d_1$, $d_2$, and $d_3$, respectively, where $d_1 > d_2 > d_3$. For example, regions 1106-1108 are identified. As a Gaussian beam of light 1116 is incident on the element 1100, portions of the beam transmitted through the regions 1106, 1109, and 1112 acquire the largest transmitted phase, portions of the beam transmitted through the regions 1107, 1110, and 1113 acquire the second largest transmitted phase, and portions of the beam transmitted through the regions 1108, 1111, and 1114 acquire the smallest transmitted phase. The element 1100 produces a Laguerre-Gaussian beam 1118 with a $LG_{30}$ transverse mode. To an observer looking toward the element 1100 along the beam 1118 axis, the beam 1118 has three intertwined helical wavefronts rotating in a clockwise direction (i.e., l=3) 1120. In other words, the regions 1106-1108 are a first set of wedge-shaped regions that produce a first of the three intertwined helical wavefronts, the regions 1109-1111 are a second set of wedge-shaped regions that produce a second of the three intertwined helical regions, and the regions 1112-1114 are a third set of wedge-shaped regions that produce a third of the three intertwined helical regions.

Figure 11C:
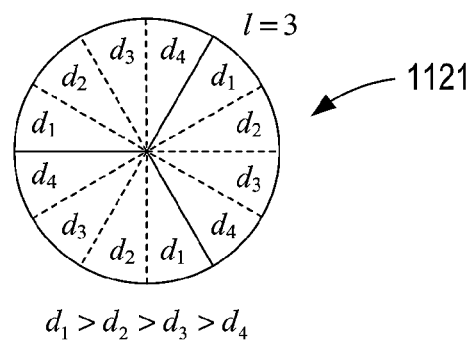

The helical wavefronts can be smoothed by increasing the number of wedge-shape regions with a more gradual change in the post diameters from region to region. FIG. 11C shows an example chiral optical element 1121 with 12 wedge-shaped regions, with the posts in each region having the same diameter. When the element 1121 is substituted for the element 1100 shown in FIG. 11B, the element 1121 also produces a Laguerre-Gaussian beam with a $LG_{30}$ transverse mode, but with smoother intertwined helical wavefronts rotating in a clockwise direction (i.e., l=3).

Figure 11D:
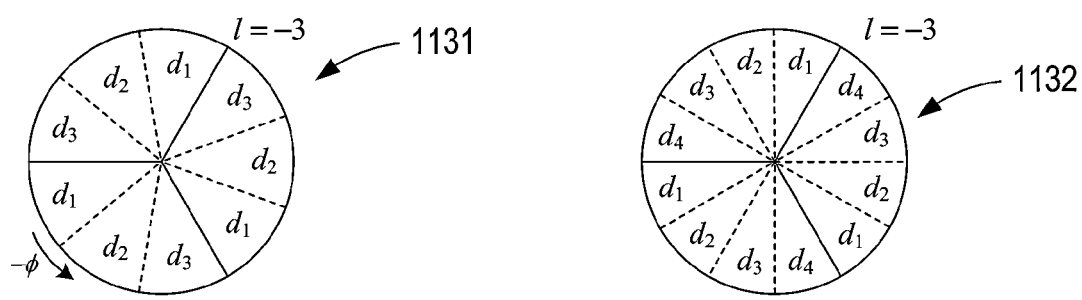

FIG. 11D shows two example chiral optical elements 1131 and 1132 that are analogous to the optical elements 1100 and 1121, but with the diameters of the posts from region to region decreasing in a counter-clockwise direction. When the elements 1131 and 1132 are substituted for the element 1100 shown in FIG. 11B, the elements 1131 and 1132 produce Laguerre-Gaussian beams with a $LG_{30}$ transverse mode, but the intertwined helical wavefronts rotate in a counter-clockwise direction (i.e., l=−3).

Figure 12:
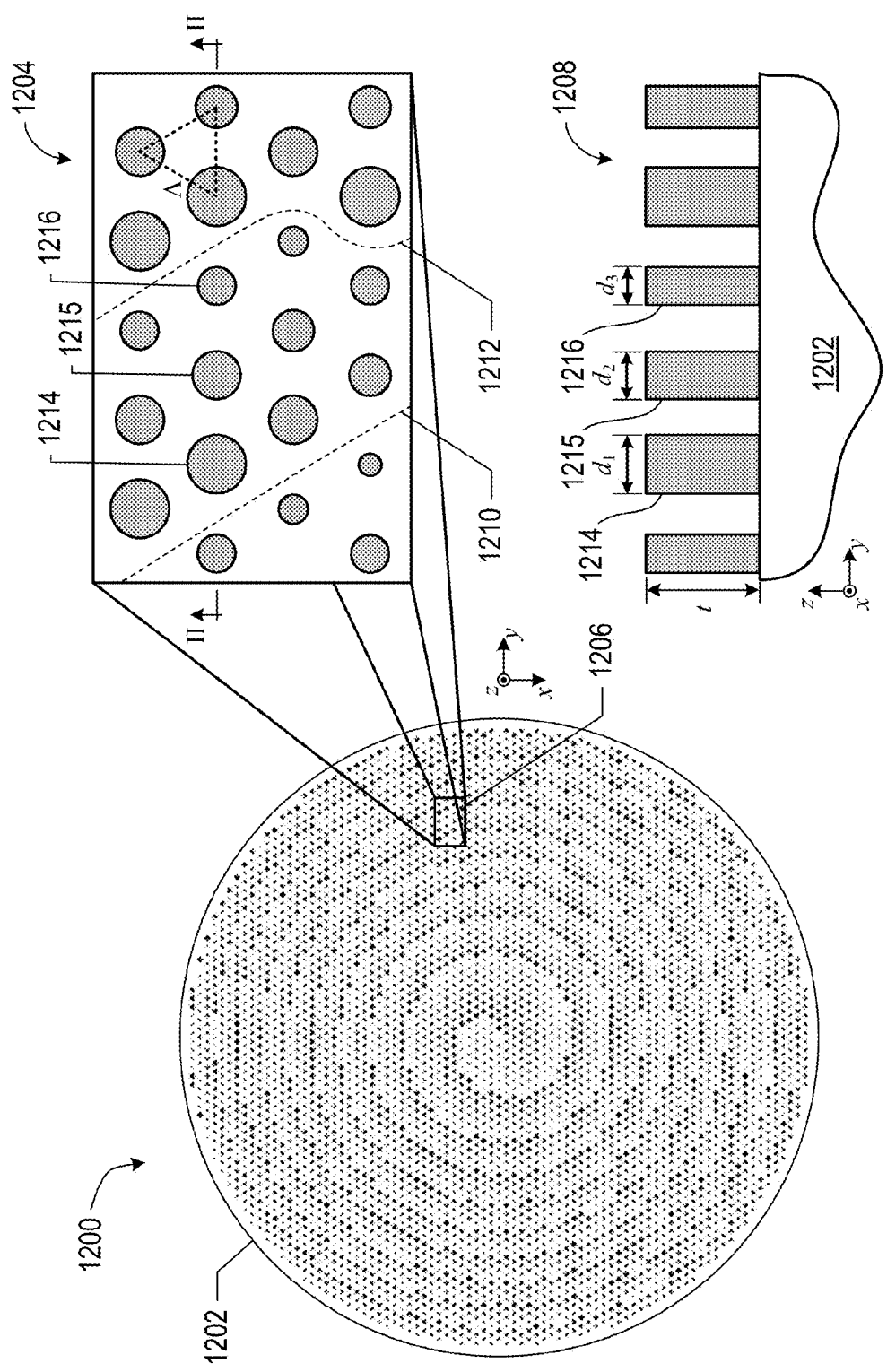
FIG. 12 shows an example chiral optical element with a spiral sub-wavelength grating pattern.

Chiral optical elements are not limited to SWGs with wedge-shaped regions. FIG. 12 shows an example chiral optical element 1200 with a SWG composed of a spiral post pattern. The SWG is disposed on a substrate 1202 and is composed of a two-dimensional hexagonal lattice of cylindrical posts that extend perpendicular from a planar surface of the substrate 1202. As shown in the example of FIG. 12, the spiral pattern of posts winds around the center of the SWG in a counter-clockwise manner. The winding curve of the spiral is a band of posts that decrease in diameter away from the center of the SWG. FIG. 12 includes a magnified view 1204 of a region 1206 of the SWG and a cross-sectional view 1208 of the region 1206 along a line II-II. The views 1204 and 1208 reveal that the SWG is composed of a two-dimensional hexagonal lattice with a lattice constant Λ. In magnified view 1204, dashed curves 1210 and 1212 identify the boundaries of a spiral curve of the SWG. In the example of FIG. 12, the diameters of the posts in the band decrease away from the center of the SWG. For example, as shown in views 1204 and 1208, the diameters $d_1$, $d_2$, and $d_3$ of the posts 1214-1216, respectively, decrease away from the center of the SWG. The optical element 1200 produces a Laguerre-Gaussian beam with a $LG_{10}$ transverse mode or a single helical wavefront with optical helicity l=1.

Chiral optical elements with spiral arrangements of posts are not intended to be limited to configuration of posts associated with the element 1200. Alternatively, a chiral optical element can include a spiral SWG with a clockwise spiral band of posts that winds around the center of the SWG. In addition, the winding curve of the spiral can be composed of a band of posts that increase in diameter away from the center of the SWG.

Light-Detection Systems

Figure 13:
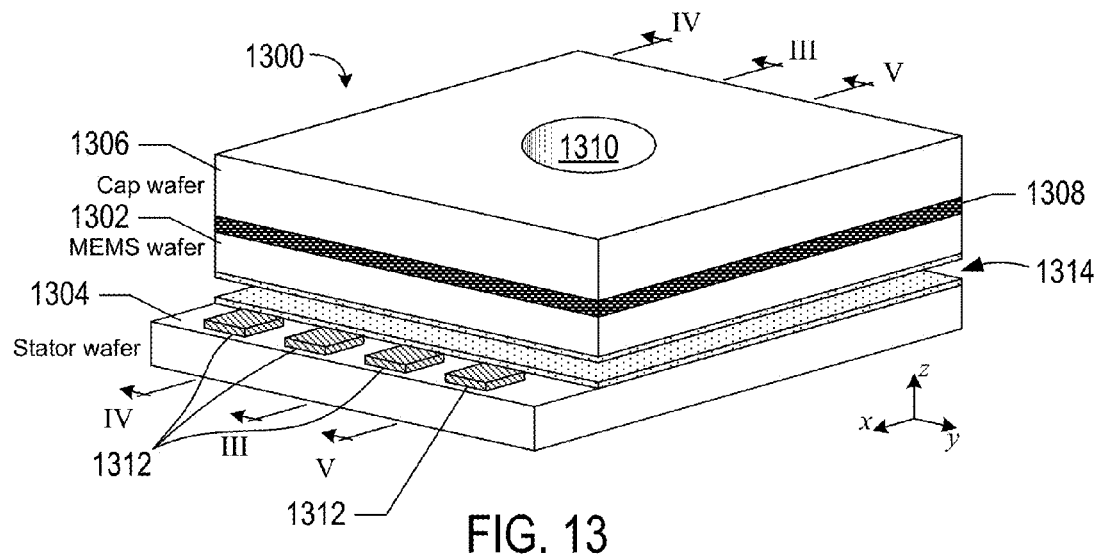
FIG. 13 shows an isometric view of an example light-detection system.

FIG. 13 shows an isometric view of an example light-detection system 1300. The system 1300 includes a MEMS wafer 1302 located between a stator wafer 1304 and a cap wafer 1306. The cap wafer 1306 is attached to the MEMS wafer 1304 with a bond material 1308 and includes an opening 1310. The bond material 1308 can be a eutectic solder bond, thermal bond, anodic bond, or glue that enables heat and current to dissipate. The stator wafer 1304 includes electrical bond pads 1312 that enable current and electronic signals to be sent to and from the system 1300. The bond pads 1312 can alternatively be located on the MEMS wafer 1302 thereby reducing the size of the stator wafer 1304. The connection region 1314 between the MEMS wafer 1302 and the stator wafer 1304 is described below with reference to FIG. 15. The wafers 1302, 1304, and 1306 can be composed of Si or another suitable semiconductor. Alternatively, the MEMS wafer 1304 can be composed of glass or another suitable insulating material.

Figure 14:
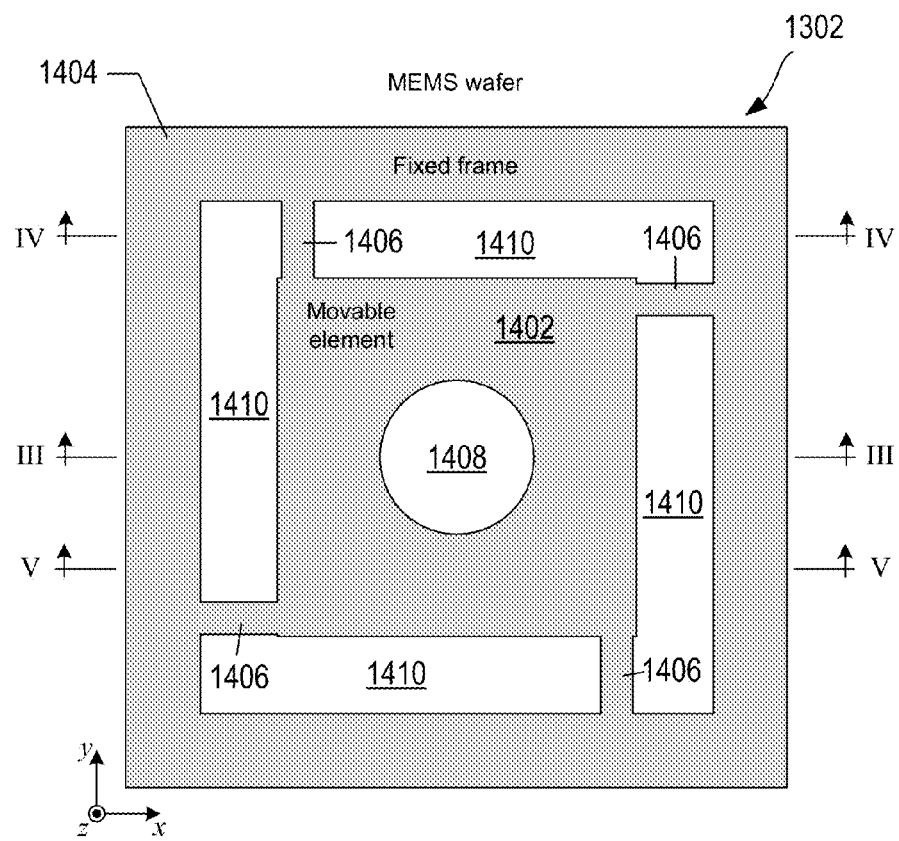
FIG. 14 shows a top plan view of an example MEMS wafer.

FIG. 14 shows a top plan view of an example configuration for the MEMS wafer 1302. The wafer 1302 includes a movable element 1402 surrounded by a frame 1404. In the example of FIG. 14, the movable element 1402 is connected to the frame 1404 via four flexures 1406 and includes an opening 1408. The MEMS wafer 1302 can be formed from a single wafer with material removed to form the opening 1408 and open spaces 1410 between the movable element 1402 and the frame 1404. The MEMS wafer 1302 is not limited to having four flexures 1406. The number of flexures can range from as few as two to more than four. The flextures 1406 can also be located anywhere along the edge of the movable element 1402. The flexures 1406 suspend the movable element 1402 between the cap wafer 1306 and the stator wafer 1304 and allow the movable element 1402 to move relative to the frame 1404.

Figure 15A:
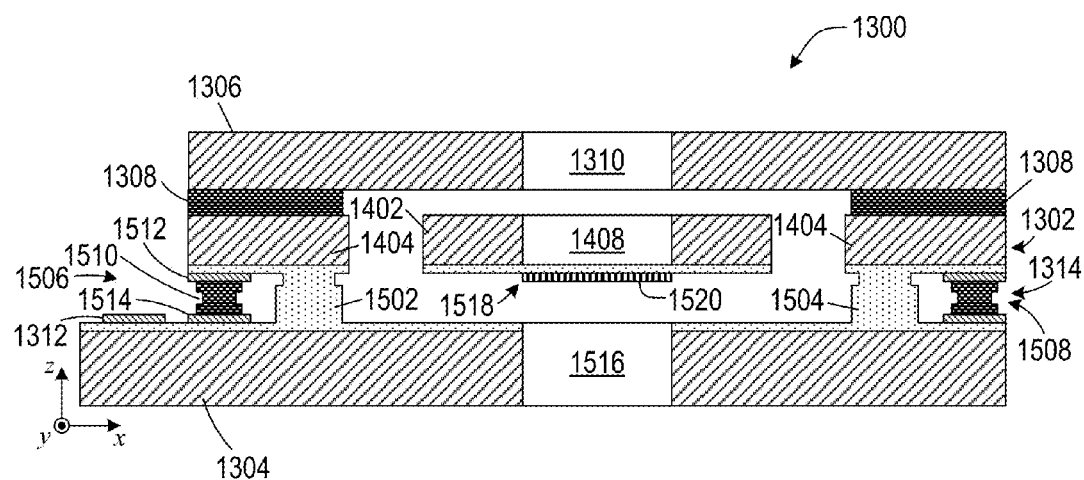
FIGS. 15A-15C show three cross-sectional views of the light-detection system shown in FIG. 13.

FIG. 15A shows a cross-sectional view of the light-detection system 1300 along a line III-III shown in FIGS. 13 and 14. FIG. 15A shows the movable element 1402 suspended between the cap wafer 1306 and the stator wafer 1304 and reveals the structure of the connection region 1314 identified in FIG. 13. The region 1314 includes standoffs 1502 and 1504 composed of a dielectric material, such as $SiO_2$ and $Al_2O_3$, that set the gap distance between the MEMS wafer 1302 and the stator wafer 1304. The region 1314 also includes electrical connections 1506 and 1508 between the MEMS wafer 1302 and the stator wafer 1304. For example, the electrical connection 1506 includes a conductive eutectic solder bond 1510 disposed between bond pads 1512 and 1514 located on the wafers 1302 and 1304, respectively. FIG. 15A shows the bond material 1308 also sets the gap distance between the MEMS wafer 1302 and the cap wafer 1306. In other words, the frame 1404 is attached to the wafers 1304 and 1306. FIG. 15A also reveals an opening 1516 in the stator wafer 1304 and a cross-sectional view of a chiral optical element 1518 disposed on the movable element 1402 between the MEMS wafer 1302 and the stator wafer 1304. The SWG 1520 of the element 1518 covers the opening 1408. The openings 1310, 1408, and 1516 in the wafers 1306, 1302, and 1304 are aligned to allow light to pass through the light-detection system 1300 and interact with the SWG 1520.

Figure 15B:
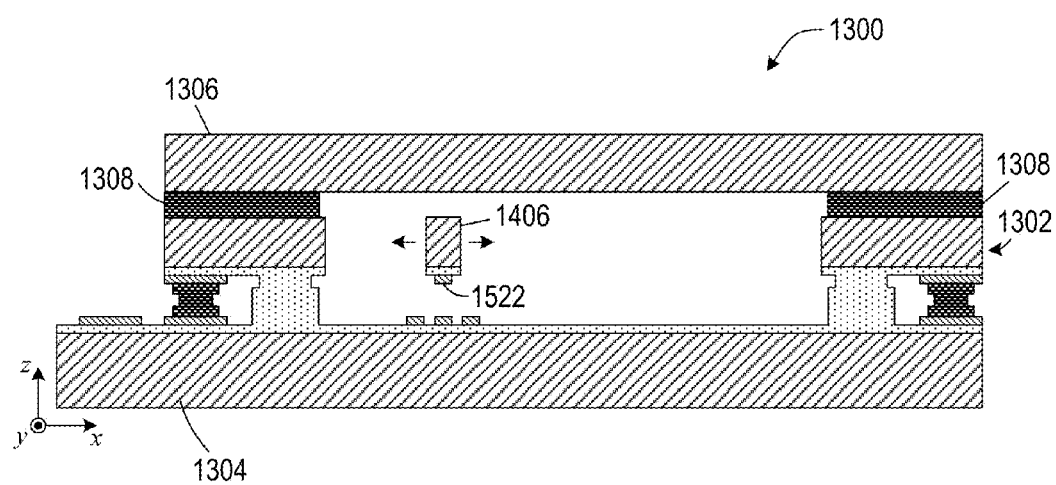
Figure 15C:
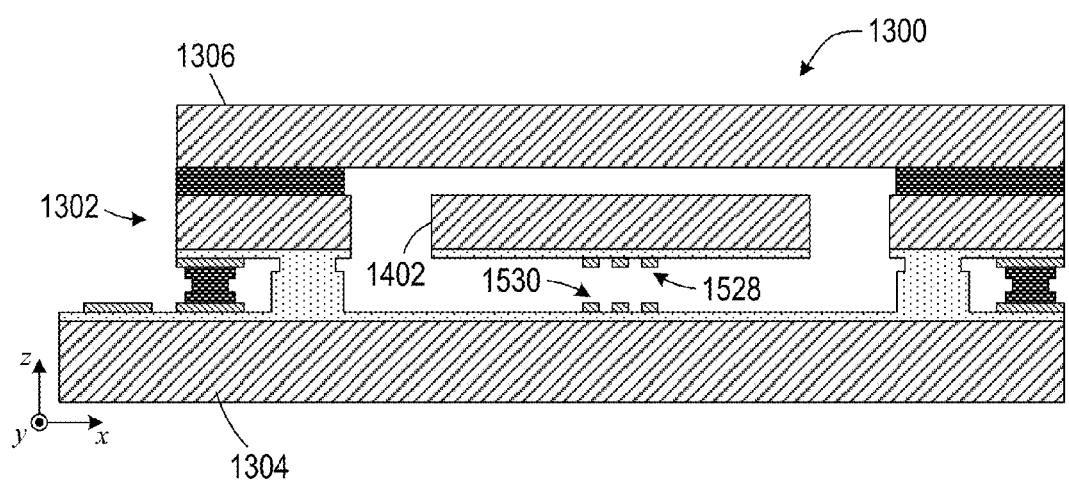

FIGS. 15B-15C show cross-sectional view of the light-detection system 1300, along lines IV-IV, V-V, and VI-VI shown in FIGS. 13 and 14, to reveal possible locations for metal signal line interconnects and sensors used to detect changes in the position of the movable element 1402 relative to the fixed position of the frame 1404. In FIG. 15B, metal line 1522 is used to establish contact with sensing electrodes located on the movable element 1402. In FIG. 15C, a sensor is composed a first set of electrodes 1528 disposed on the movable element 1402 and a second set of electrodes 1530 disposed on the stator wafer 1304.

Figure 16:
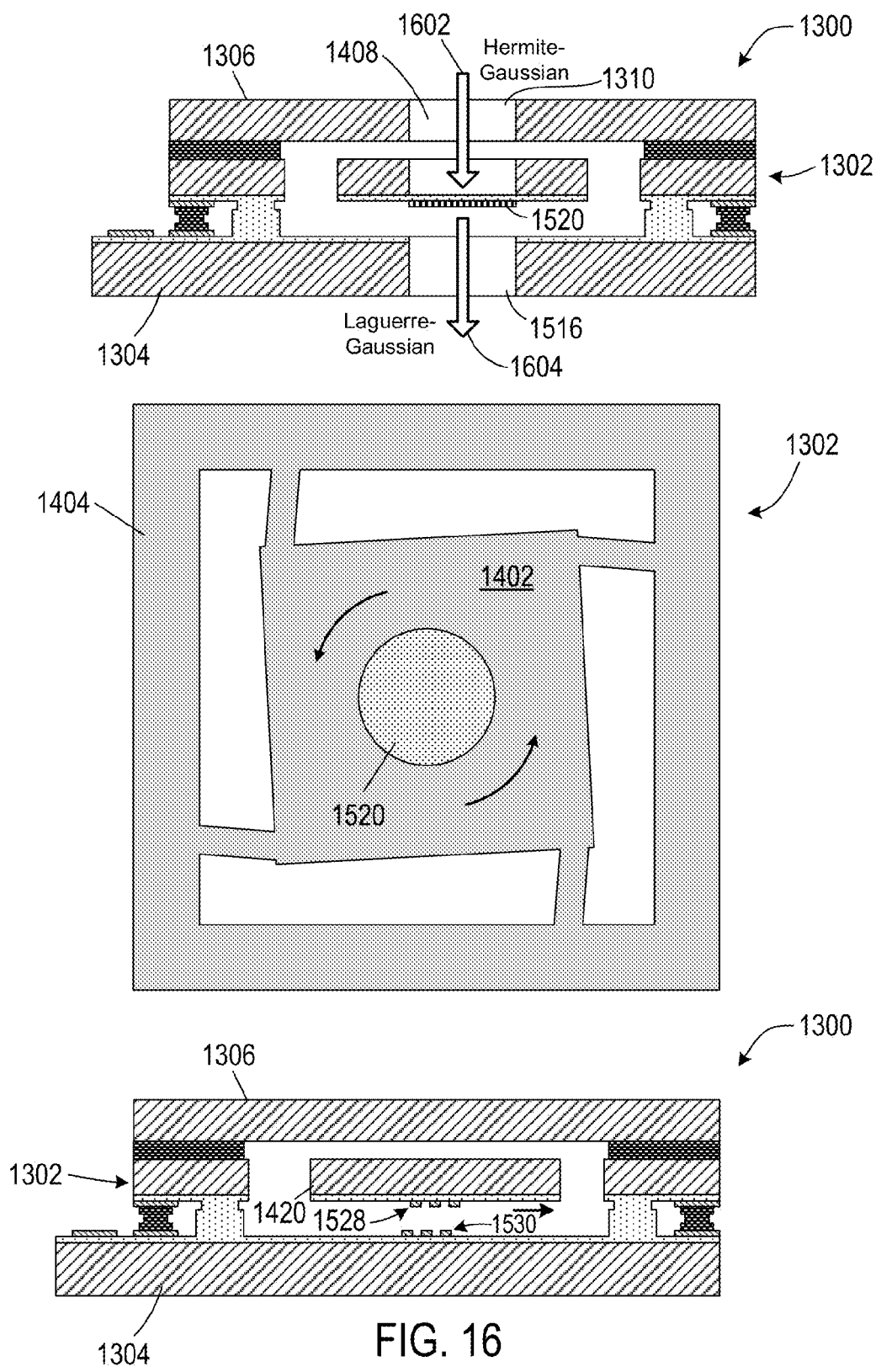
FIG. 16 shows an example of the light-detection system shown in FIG. 13 in operation.

FIG. 16 shows an example of the light-detection system 1300 in operation. FIG. 16 includes the cross-sectional view along the line III-III described above with reference to FIG.

15A. A Hermite-Gaussian beam of light to be detected enters the system 1300 through the opening 1310 in the cap wafer 1306 and the opening 1408 in the MEMS wafer 1302. The SWG 1520 is configured as described above in the preceding subsection to impart an orbital angular momentum on the light as the light passes through the SWG 1520. The light emerges from the SWG 1520 and passes through the opening 1516 as a Laguerre-Gaussian beam with at least one helical wavefront. Directional arrows 1602 and 1604 represent the direction of the beam of light before and after the beam interacts with the SWG 1520 and represent how the path of the beam is unchanged as the beam passes through the SWG 1520. As the light passes through the SWG 1520, the photons exert a torque on the movable element 1402. As a photon of temporal duration Δt passes through the SWG 1520, the photon exerts an instantaneous torque on the SWG 1520 given by:

$$\tau = \frac{lh}{\Delta t}$$

The instantaneous torque can also be represented by $$\tau(t) = \frac{lP(t)}{\omega}$$

where ω is the angular frequency and P(t) is the instantaneous power of the light. In FIG. 16, the top plan view of the MEMS wafer 1302 reveals that the torque exerted on SWG 1520 causes the movable element 1402 to rotate relative to the fixed position of the frame 1404. FIG. 16 also reveals in a cross-sectional view of the movable element 1402 rotated in the plane of the MEMS wafer 1302 to produce a corresponding change in the overlap area of the sensor electrodes. A detectable change in the capacitance of a sensor can be used to detect light passing through the light-detection system 1300. The capacitance is proportional to the ratio between the capacitor area and gap distance between the electrode on the MEMS wafer 1302 and the electrode located on the stator wafer 1304 (i.e., capacitance∝area/gap). Depending on the configuration of the sensor, a rotation of the movable element 1402 changes either the effective area or gap of the sensor causing a change in capacitance. This change in capacitance can be detected via an analog circuitry. In the example of FIG. 16, because the movable element 1402 is rotated under the influence of light passing through the SWG 1520, the change in capacitance at the sensors is due to a change in the area of the capacitor.

The maximum, static displacement of the moving element is given by $$x_{DC} = \frac{2\tau}{k'a}$$

where k' is the stiffness or spring constant of the flexures 1406 in rotation, and a is length of the sides of the movable element 1402. The parameter $x_{DC}$ is the linear displacement of the edge of the movable element 1402 as the element 1402 rotates. The resonant frequency of the moving element is given by:

$$\Omega_{res} = \sqrt{\frac{3k'}{2m}}$$

where m is the combined mass of the movable element 1402 and the chiral optical element 1518.

Table 1 provides calculated values for the displacement of the movable element 1402 in three example sensing systems and for various parameters associated with a MEMS wafer and SWG configured to impart an optical helicity l=1:

TABLE 1

| a | m | k' | $Q_{res}/2\pi$ | $x_{DC}/P$ |
|---|---|---|---|---|
| 20 μm | 0.1 ng | 0.1 N/m | ~300 kHz | ~$10^{-3}$ nm/mW |
| 20 μm | 0.1 ng | 10 N/m | ~30 MHz | ~$10^{-5}$ nm/mW |
| 2 mm | 1 μg | 1 N/m | ~300 Hz | ~$10^{-6}$ nm/mW |

A high frequency carrier signal and a phase lock loop detector can also be used to demodulate the carrier signal and recover the displacement of the movable element 1402. This technique provides higher resolution than a DC measurement of capacitance change and can be resolved to about $10^{-14}$ m using a 2 mm×2 mm movable element 1402.

Figure 17:
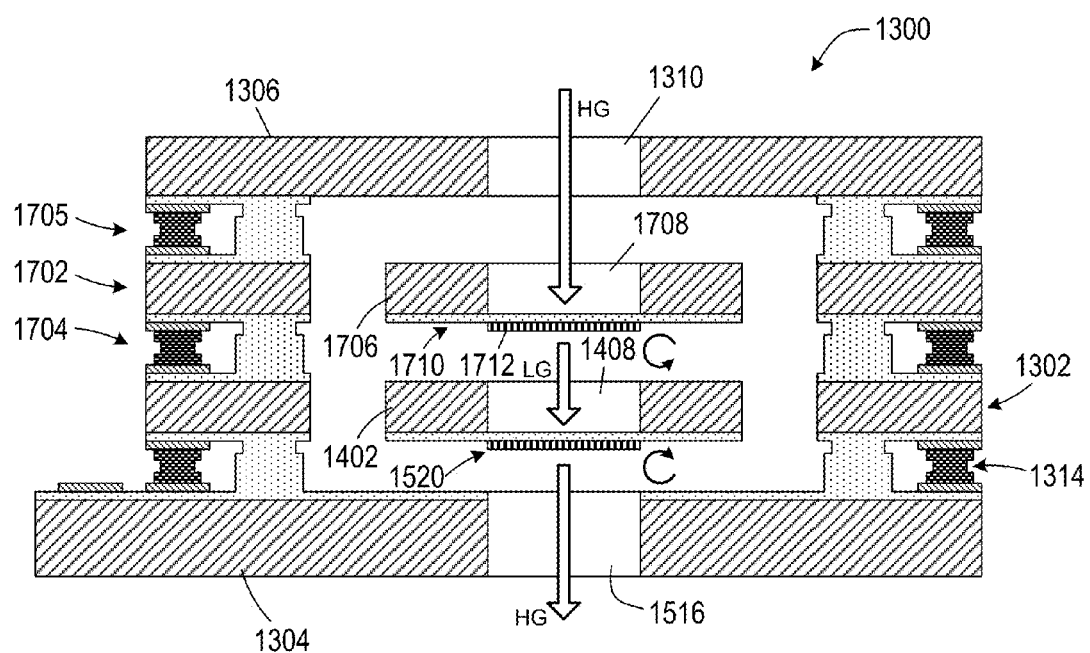
FIG. 17 shows a cross-sectional view of an example light-detection system with two MEMS wafers.

Alternatively, a light-detection system can have two MEMS wafers with two chiral optical elements of opposite chirality to restore the spatial profile to the beam transmitted through the light-detection system. The two chiral optical elements create a differential rotation that can be measured to improve the sensitivity of the light-detection system by a factor of 2. FIG. 17 shows a cross-sectional view of an example light-detection system 1700 with two MEMS wafers and associated chiral optical elements. The system 1700 is similar to the system 1300 except a second MEMS wafer 1702 and two component regions 1704 and 1705 are disposed between the cap wafer 1306 and the MEMS wafer 1302. The MEMS wafer 1702 is similar to the MEMS wafer 1302 and includes an opening 1708 in a suspended movable element 1706. The opening 1708 is aligned with the openings 1310, 1408, and 1516 in the wafers 1306, 1402 and 1304, respectively. The MEMS wafer 1702 also includes a chiral optical element 1710 attached to one side of the movable element 1706. The optical element 1710 includes a SWG 1712 that covers the opening 1708 and is configured with opposite chirality to that of the SWG 1520. The SWGs 1712 and 1520 in combination output a beam with the spatial profile restored. Sensors can be located on the MEMS wafers 1702 and the cap wafer 1306 as described above with reference to FIGS. 15B-15D to detect rotational changes in the movable element 1706. For example, suppose the SWG 1712 is configured to output a Laguerre-Gaussian beam with l=+1 and the SWG 1520 is configured to output a Laguerre-Gaussian beam with l=−1. Suppose a Hermite-Gaussion beam of light with a $HG_{mn}$ transverse profile is input to the opening 1310. The SWG 1712 outputs a Laguerre-Gaussian beam with l=+1 and the SWG 1520 applies the opposite chirality of l=−1. As a result, the beam of light output through the opening 1512 in the stator wafer 1304 is a Hermite-Gaussian beam with a $HG_{mn}$ transverse profile. The movable elements 1402 and 1706 are rotated in opposite directions. Note that the light-detection system 1700 does not destroy the beam of light or change the propagation direction of the beam of light.

Figure 18A:
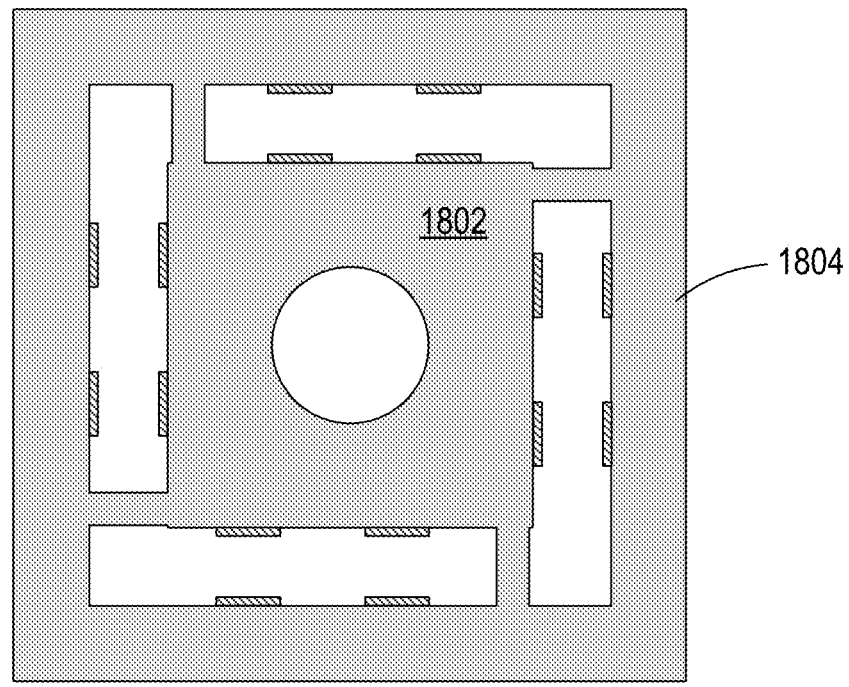
FIGS. 18A-18B show top plan views of two example MEMS wafers with sensors located within openings between a movable element and a frame.
Figure 18B:
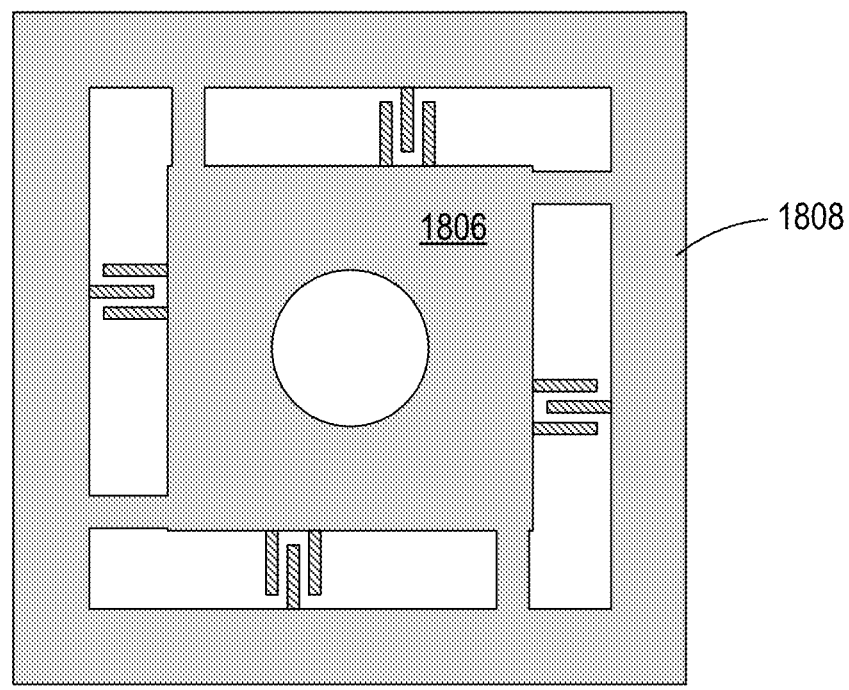

Light-detection systems are not limited to locating the sensors between the movable element and the stator wafer or the cap wafer, as described above with reference to FIGS. 15 and 17. Alternatively, the sensors can be located within the MEMS wafer between the movable element and the frame. FIGS. 18A-18B show top plan views of two example MEMS wafers with sensors located within the openings between the movable element and the frame. In FIG. 18A, the sensors are composed of opposite facing electrodes located in each opening between a movable element 1802 and a frame 1804. In this configuration, the gap of the capacitor changes in response to motion of the movable element 1802. In FIG. 18B, the sensors are composed of interleaved finger-like projection electrodes located in each opening between a movable element 1806 and a frame 1808. In this configuration, the area and gap of the capacitors change in response to motion of the movable element 1806.

The foregoing description, for purposes of explanation, used specific nomenclature to provide a thorough understanding of the disclosure. However, it will be apparent to one skilled in the art that the specific details are not required in order to practice the systems and methods described herein. The foregoing descriptions of specific examples are presented for purposes of illustration and description. They are not intended to be exhaustive of or to limit this disclosure to the precise forms described. Obviously, many modifications and variations are possible in view of the above teachings. The examples are shown and described in order to best explain the principles of this disclosure and practical applications, to thereby enable others skilled in the art to best utilize this disclosure and various examples with various modifications as are suited to the particular use contemplated. It is intended that the scope of this disclosure be defined by the following claims and their equivalents:

The invention claimed is:

1. An optical element comprising:
a substrate having a planar surface; and
a polarization insensitive, high contrast, sub-wavelength grating composed of posts that extend from the planar surface, the posts and/or lattice arrangement of the posts are non-periodically varied to impart orbital angular momentum and at least one helical wavefront on the light transmitted through the optical element,
wherein the grating further comprises wedge-shaped regions, the posts within each region having approximately the same cross-sectional dimensions, and the cross-sectional dimensions of the posts varied from region to region in a clockwise or counter-clockwise manner.

2. The element of claim 1, wherein the lattice arrangement of the posts further comprises the posts having at least one two-dimensional regular geometrical lattice arrangement.

3. The element of claim 1, wherein the grating further comprises a thickness that satisfies a condition $$t < \frac{\lambda}{(n_{SWG} - n_s)}$$

where t is the thickness of the grating, $\lambda$ is the wavelength of the light, and $n_s$ and $n_{SWG}$ are the refractive index of the substrate and the effective refractive index of the grating, respectively, at the wavelength $\lambda$.

4. The element of claim 1, wherein the posts and/or lattice arrangement of the posts are non-periodically varied to impart orbital angular momentum and at least one helical wavefront further comprises the posts are non-periodically varied to output a Laguerre-Gaussian beam of light.

5. A light-detection system comprising:
a stator wafer with an opening;
a micro-electromechanical ("MEMS") wafer including a suspended movable element connected to a frame via at least two flexures, the frame attached to the stator wafer and the movable element having an opening aligned with the opening in the stator wafer; and
a chiral optical element disposed on a surface of the movable element to cover the opening in the movable element, wherein light to pass through the chiral optical element exerts a torque on the chiral optical element that rotates the movable element.

6. The system of claim 5, wherein the chiral optical element further comprises:
a substrate having a planar surface disposed on the surface of the movable element; and
a polarization insensitive, high contrast, sub-wavelength grating that covers the opening in the movable element, the grating including posts that extend from the planar surface, the posts and/or lattice arrangement of the posts are non-periodically varied to impart orbital angular momentum and at least one helical wavefront on the light transmitted through the chiral optical element.

7. The system of claim 6, wherein the posts and/or lattice arrangement of the posts are non-periodically varied to impart orbital angular momentum and at least one helical wavefront further comprises the posts are non-periodically varied to output a Laguerre-Gaussian beam of light.

8. The system of claim 5, further comprising a connection region between the stator wafer and the MEMS wafer, wherein the connection region includes:
standoffs that set a gap distance between the stator and MEMS wafers;
electrical connections between the MEMS wafer and the stator wafer; and
at least one bond pad disposed on a surface of the stator wafer and/or the MEMs wafer to form electrical interconnections between the MEMS wafer and the stator wafer.

9. The system of claim 5, further comprising at least one sensor with at least one electrode attached to the movable element and at least one electrode attached to the stator wafer to detect a change in capacitance when the movable element is rotated by the light to pass through the chiral optical element.

10. The system of claim 5, further comprising at least one sensor with at least one electrode attached to the movable element and at least one electrode attached to the frame to detect a change in capacitance when the movable element is rotated by the light to pass through the chiral optical element.

11. The system of claim 5, further comprising:
a second MEMS wafer including a suspended second movable element connected to a second frame via at least two flexures, the second frame attached to the frame and the second movable element having an opening aligned with the openings in the movable element and the stator wafer; and
a second chiral optical element disposed on a surface of the second movable element to cover the opening in the second movable element, the second chiral optical element having a chirality opposite that of the chiral optical element, wherein light to pass through the chiral optical element exerts a torque on the chiral optical element that rotates the movable element and exerts a torque on the second chiral optical element that rotates the second movable element.

12. The system of claim 5, further comprising a cap wafer with an opening aligned with the openings in the MEMS wafer and the opening in the stator wafer.

13. An optical element comprising:
a substrate having a planar surface; and
a polarization insensitive, high contrast, sub-wavelength grating composed of posts that extend from the planar surface, the posts and/or lattice arrangement of the posts are non-periodically varied to impart orbital angular momentum and at least one helical wavefront on the light transmitted through the optical element,
wherein the grating further comprises a spiral grating composed of a spiral band of posts that winds around the center of the grating in a clockwise or counter-clockwise manner with cross-sectional dimensions that decrease within the band away from the center of the grating or with cross-sectional dimensions that increase within the band away from the center of the grating.

* * * * *